(12) United States Patent
Hsieh

(10) Patent No.: US 11,935,901 B2
(45) Date of Patent: Mar. 19, 2024

(54) ARRAY SUBSTRATE, DISPLAY PANEL, AND DISPLAY DEVICE

(71) Applicant: BOE TECHNOLOGY GROUP CO., LTD., Beijing (CN)

(72) Inventor: Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/990,021

(22) Filed: Nov. 18, 2022

(65) Prior Publication Data

US 2023/0081320 A1 Mar. 16, 2023

Related U.S. Application Data

(63) Continuation of application No. 16/760,236, filed as application No. PCT/CN2019/110371 on Oct. 10, 2019, now Pat. No. 11,695,017.

(30) Foreign Application Priority Data

Oct. 11, 2018 (CN) .......................... 201811185860.1

(51) Int. Cl.
*H01L 27/12* (2006.01)
(52) U.S. Cl.
CPC .................. *H01L 27/124* (2013.01)
(58) Field of Classification Search
CPC ............. H01L 27/124; G02F 1/136286; G02F 1/136209; H10K 59/131; H10K 59/126
See application file for complete search history.

(56) References Cited

U.S. PATENT DOCUMENTS

2011/0128280 A1  6/2011 Tseng et al.
2012/0069042 A1  3/2012 Ogita et al.
(Continued)

FOREIGN PATENT DOCUMENTS

CN  106154673 A  11/2016
CN  106920470 A  7/2017
(Continued)

OTHER PUBLICATIONS

Japanese Notice of Reasons for Refusal (w/ English translation) for corresponding JP Application No. 2020-567224, dated Jun. 6, 2023, 19 pages.

(Continued)

*Primary Examiner* — Peter M Albrecht
(74) *Attorney, Agent, or Firm* — Dority & Manning, P.A.

(57) ABSTRACT

A display panel has a first region and a second region on side(s) thereof, a light transmittance of the first region is greater than that of the second region. The display panel includes pixels, first wirings arranged in a second direction that intersect a first region, and second wirings arranged in the first direction, all of which are in the first region and the second region. The first wirings and the second wirings are electrically connected to the pixels. First wirings passing through the first region are divided into first wiring groups, and first wirings in each first wiring group are gathered in the first region to constitute a first gathering portion. A distance between two adjacent first wirings in the second region is less than a distance between two adjacent first gathering portions, and is greater than a distance between two adjacent first wirings in the first gathering portion.

20 Claims, 10 Drawing Sheets

(56) References Cited

U.S. PATENT DOCUMENTS

| | | |
|---|---|---|
| 2013/0113843 A1 | 5/2013 | Yamazaki |
| 2013/0314347 A1 | 11/2013 | Muraoka et al. |
| 2014/0220422 A1 | 8/2014 | Rogers et al. |
| 2014/0269064 A1 | 9/2014 | Jeon et al. |
| 2016/0018645 A1 | 1/2016 | Haddick et al. |
| 2016/0109852 A1 | 4/2016 | Kuwabara et al. |
| 2016/0266695 A1 | 9/2016 | Bae et al. |
| 2016/0365406 A1 | 12/2016 | Adachi et al. |
| 2017/0250240 A1 | 8/2017 | Lee et al. |
| 2018/0040680 A1 | 2/2018 | Cai |
| 2018/0122302 A1 | 5/2018 | Koong |
| 2018/0130421 A1 | 5/2018 | Zhou et al. |
| 2018/0219058 A1 | 8/2018 | Xiang et al. |
| 2018/0331148 A1 | 11/2018 | Yokoyama et al. |
| 2018/0364530 A1 | 12/2018 | Wang et al. |
| 2019/0130822 A1 | 5/2019 | Jung et al. |
| 2019/0165075 A1 | 5/2019 | Yuan et al. |
| 2020/0365674 A1 | 11/2020 | Jeon et al. |
| 2021/0118909 A1 | 4/2021 | Hsieh |

FOREIGN PATENT DOCUMENTS

| | | |
|---|---|---|
| CN | 106921767 A | 7/2017 |
| CN | 107731886 A | 2/2018 |
| CN | 107910352 A | 4/2018 |
| CN | 108074533 A | 5/2018 |
| CN | 108227327 A | 6/2018 |
| CN | 207636882 U | 7/2018 |
| CN | 207720239 U | 8/2018 |
| CN | 207781599 U | 8/2018 |
| CN | 108490710 A | 9/2018 |
| CN | 108520888 A | 9/2018 |
| CN | 207947006 U | 10/2018 |
| JP | 2005338796 A | 12/2005 |
| KR | 20090029613 A | 3/2009 |
| KR | 20170024182 A | 3/2017 |
| WO | WO2011089975 A1 | 7/2011 |

OTHER PUBLICATIONS

Chinese First Office Action (w/ English translation) for corresponding Chinese Application No. 201811185860.1, dated Sep. 15, 2020, 25 pages.
Chinese Second Office Action (w/ English translation) for corresponding Chinese Application No. 201811185860.1, dated Jun. 4, 2021, 13 pages.
Extended European Search for corresponding European Application No. 19872172.2, dated May 31, 2022, 12 pages.
Indian Office Action (w/ English translation) for corresponding Indian Application No. 202027048228, dated Aug. 12, 2021, 5 pages.
Notification to Grant Patent Right for Invention (w/ English translation) for corresponding Chinese Application No. 201811185860.1, dated Nov. 1, 2021, 9 pages.
PCT International Search Report and Written Opinion (with English translations) for corresponding PCT Application No. PCT/CN2019/110371, dated Dec. 30, 2019, 19 pages.
U.S. Restriction Requirement for corresponding U.S. Appl. No. 16/760,236, dated May 4, 2022, 19 pages.
European Office Action for corresponding EP Application No. 19872172.2, dated May 30, 2023, 20 pages.
Japanese Notice of Reasons for Refusal (w/ English translation) for corresponding JP Application No. 2020-567224, dated May 30, 2023, 19 pages.
Yumoto et al., "Pixel-Driving Methods for Large-Sized Poly-Si AM-OLED Displays", Asia Display/IDW '01, Proceedings of the 21$^{st}$ International Display Research Conference in Conjunction with the 8$^{th}$ International Display Workshops, 2001, pp. 1395-1398.
United States Ex parte Quayle Office Action for corresponding U.S. Appl. No. 16/760,236, dated Dec. 23, 2022, 11 pages.
EP Summons to Attend Oral Proceedings and Annex for corresponding EP Application No. 19872172.2, dated Nov. 27, 2023, 20 pages.

ARRAY SUBSTRATE, DISPLAY PANEL, AND DISPLAY DEVICE

CROSS-REFERENCE TO RELATED APPLICATIONS

This application is a continuation of U.S. patent application Ser. No. 16/760,236, filed on Apr. 29, 2020, which claims priority to International Patent Application No. PCT/CN2019/110371, filed on Oct. 10, 2019, which in turn claims priority to Chinese Patent Application No. 201811185860.1, filed on Oct. 11, 2018, which are incorporated herein by reference in their entirety.

TECHNICAL FIELD

The present disclosure relates to the field of display technologies, and in particular, to an array substrate, a display panel and a display device.

BACKGROUND

Screen-to-body ratio of a display screen refers to a ratio of an area of a display area of a display surface of the display screen to a total area of the display surface of the display screen. Large screen-to-body ratio is one of the development trends of the field of display technologies. A full screen refers to a screen where the area of the display area of the display surface of the display screen is equal to or approximately equal to the total area of the display surface of the display screen, and has a high screen-to-body ratio.

SUMMARY

In one aspect, a display panel is provided. The display panel includes a first region and a second region located on at least one side of the first region, a light transmittance of the first region being greater than a light transmittance of the second region. The display panel includes a plurality of pixels located in the first region and the second region, a plurality of first wirings sequentially arranged in a second direction, and a plurality of second wirings sequentially arranged in a first direction. The plurality of first wirings are located in the first region and the second region, and are electrically connected to the plurality of pixels. The plurality of second wirings are located in the first region and the second region, and are electrically connected to the plurality of pixels; the first direction and the second direction intersect. First wirings passing through the first region in the plurality of first wirings include a plurality of first wiring groups, and first wirings in each first wiring group are gathered in the first region to constitute a first gathering portion. A distance between two adjacent first gathering portions is greater than a distance between two adjacent first wirings in the second region; and a distance between two adjacent first wirings in the first gathering portion is less than the distance between the two adjacent first wirings in the second region.

In some embodiments, a part of the first wirings in each first wiring group are electrically connected to a part of pixels located in the first region, and another part of the first wirings in the first wiring group are electrically connected to a part of pixels located in the second region and are not electrically connected to the pixels located in the first region.

In some embodiments, display panel further includes at least one first light-shielding strip disposed in the first region. The at least one first light-shielding strip is disposed on a side of the plurality of first wiring groups away from or proximate to a display surface of the display panel; and a first light-shielding strip in the at least one first light-shielding strip is configured to block a gap between at least two adjacent first wirings in a corresponding first wiring group in the first region.

In some embodiments, in the second direction, two opposite borders of the first light-shielding strip exceed two first wirings located at two ends of the corresponding first wiring group, respectively.

In some embodiments, an orthographic projection, on the display panel, of the first gathering portion constituted by the first wirings in the first wiring group in the first region is located within an orthographic projection of a corresponding first light-shielding strip on the display panel.

In some embodiments, the at least one first light-shielding strip includes a plurality of first light-shielding strips; and in the plurality of first light-shielding strips, a ratio of a width of a first light-shielding strip to a distance between two adjacent first light-shielding strips is greater than 0, and less than or equal to 0.5.

In some embodiments, a first wiring in the plurality of first wirings includes one or more first sub-wirings.

In some embodiments, second wirings passing through the first region in the plurality of second wirings include a plurality of second wiring groups, and second wirings in each second wiring group are gathered in the first region to constitute a second gathering portion. A distance between two adjacent second gathering portions is greater than a distance between two adjacent second wirings in the second region. A distance between two adjacent second wirings in the second gathering portion is less than the distance between the two adjacent second wirings in the second region.

In some embodiments, a part of the second wirings in each second wiring group are electrically connected to a part of pixels located in the first region, and another part of the second wirings in the second wiring group are electrically connected to a part of pixels located in the second region and are not electrically connected to the pixels located in the first region.

In some embodiments, the display panel further includes at least one second light-shielding strip disposed in the first region. The at least one second light-shielding strip is disposed on a side of the plurality of second wiring groups away from or proximate to a display surface of the display panel. A second light-shielding strip in the at least one second light-shielding strip is configured to block a gap between at least two adjacent second wirings in a corresponding second wiring group in the first region.

In some embodiments, in the first direction, two opposite borders of the second light-shielding strip exceed two second wirings located at two ends of the corresponding second wiring group, respectively.

In some embodiments, an orthographic projection, on the display panel, of the second gathering portion constituted by the second wirings in the second wiring group in the first region is located within an orthographic projection of a corresponding second light-shielding strip on the display panel.

In some embodiments, the at least one second light-shielding strip includes a plurality of second light-shielding strips; and in the plurality of second light-shielding strips, a ratio of a width of a second light-shielding strip to a distance between two adjacent second light-shielding strips is greater than 0, and less than or equal to 0.5.

In some embodiments, the display panel further includes at least one first light-shielding strip disposed in the first region. The at least one first light-shielding strip is disposed on a side of the plurality of first wiring groups away from or proximate to the display surface of the display panel. A first light-shielding strip in the at least one first light-shielding strip is configured to block a gap between at least two adjacent first wirings in a corresponding first wiring group in the first region. The at least one first light-shielding strip and the at least one second light-shielding strip are located in a same layer, are made of a same material, and constitute a one-piece structure.

In some embodiments, the at least one first light-shielding strip includes a plurality of first light-shielding strips, and the at least one second light-shielding strip includes a plurality of second light-shielding strips; the plurality of first light-shielding strips and the plurality of second light-shielding strips constitute a grid structure, and define a plurality of light-transmissive regions. Portions of the plurality of first light-shielding strips intersecting the plurality of second light-shielding strips are a plurality of light-shielding portions, and a light-shielding portion in the plurality of light-shielding portions overlaps a corresponding pixel in the first region.

In some embodiments, a second wiring in the plurality of second wirings includes one or more second sub-wirings.

In some embodiments, the first direction is a column direction, and a first wiring in the plurality of first wirings includes at least one of a data line, an initialization signal line, a first power line and a second power line; and the second direction is a row direction, and a second wiring in the plurality of second wirings includes at least one of a gate line, a control line and a common voltage signal line. Alternatively, the first direction is the row direction, and the first wiring includes at least one of the gate line, the control line and the common voltage signal line; and the second direction is the column direction, and the second wiring includes at least one of the data line, the initialization signal line, the first power line and the second power line.

In some embodiments, a density of pixels located in the first region is less than a density of pixels in the second region.

In another aspect, a display device is provided. The display device includes the display panel according to any one of the above embodiments, and at least one sensing component disposed on a non-display surface side of the display panel. An orthographic projection of the at least one sensing component on the display panel is at least partially located in the first region.

In some embodiments, a sensing component in the at least one sensing component is a camera.

BRIEF DESCRIPTION OF THE DRAWINGS

In order to describe technical solutions in embodiments of the present disclosure or the prior art more clearly, the accompanying drawings to be used in the description of the embodiments or the prior art will be introduced briefly below. Obviously, the accompanying drawings to be described below are merely some embodiments of the present disclosure, and a person of ordinary skill in the art may obtain other drawings according to these drawings.

DETAILED DESCRIPTION

The technical solutions in embodiments of the present disclosure will be described below clearly and completely with reference to the accompanying drawings. Obviously, the described embodiments are merely some but not all of embodiments of the present disclosure. All other embodiments made on the basis of the embodiments of the present disclosure by a person of ordinary skill in the art shall be included in the protection scope of the present disclosure.

A display device according to embodiments of the present disclosure may be applied to any terminal having a display function, such as a mobile phone, a flat panel display, a computer, or a television monitor. The display device may be any device that display an image whether the image is moving (such as a video) or stationary (such as a still image), and whether the image is text or a graphic.

Hereinafter, "a display surface side" refers to a side of a display device or a display panel where an user can see images displayed by it. "A non-display surface side" refers to a side of the display device or the display panel which is opposite to the display surface side.

In some embodiments, the display device includes sensing components. In an example where a terminal to which the display device is applied is a mobile phone, the display device includes the sensing components such as a front camera, a light sensor, and a 3D sensing module. These sensing components sense light from the display surface side of the display device, so as to achieve relevant functions. For example, when the front camera of the mobile phone takes a picture, the front camera needs to collect light from an object to be photographed located at a front side (i.e., the display surface side) of the mobile phone to achieve capturing an image.

Figure 1A:
FIG. 1A is a schematic front view showing a structure of a display device in the related art.
Figure 1B:
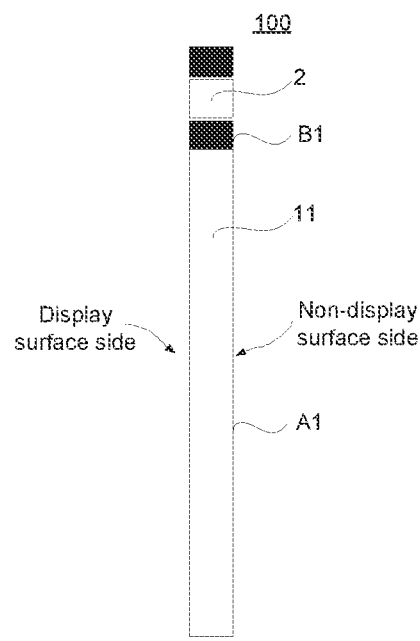
FIG. 1B is a schematic cross-sectional view of a structure taken along section line SS' in FIG. 1A.

In a related art, as shown in FIGS. 1A and 1B, a display panel 11 of a display device 100 has a display area A1 and a non-display area B1. A hole is punched in the display panel 11, and a sensing component 2 (for example, the front camera) is embedded into the hole. In this way, the sensing component 2 may sense light from the display surface side of the display panel 11.

Figure 2A:
FIG. 2A is a schematic front view showing a structure of another display device in the related art.
Figure 2B:
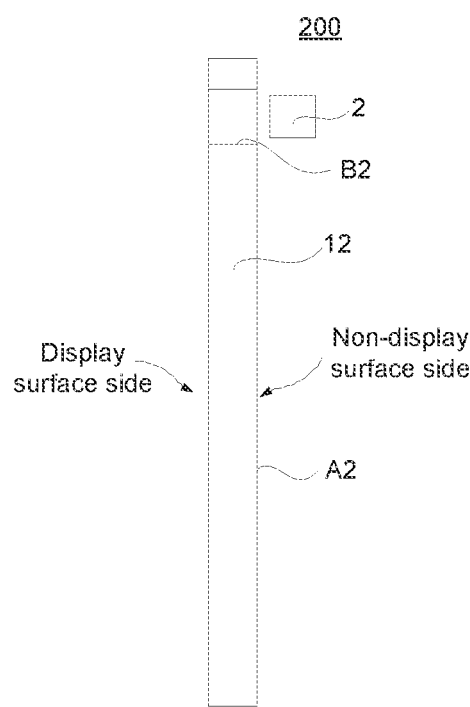
FIG. 2B is a schematic cross-sectional view of a structure taken along section line TT' of FIG. 2A.

In another related art, as shown in FIGS. 2A and 2B, a display panel 12 of a display device 200 has a display area A2 and a transparent region B2. A sensing component 2 is disposed at a non-display surface side of the display panel 12 of the display device 200, and the sensing component 2 directly faces the transparent region B2 of the display panel 12. That is, an orthographic projection of the sensing component 2 on a display surface of the display panel 12 is within the transparent region B2. In this way, light from a display surface side of the display panel 12 may pass through the transparent region B2 and be sensed by the sensing component 2.

As for the two arrangement manners of the sensing component 2, the display surface of the display panel has a region that cannot display images, which reduces the screen-to-body ratio of the display device. A ratio of an area of the display area of the display panel to a total area of the display panel may not reach 100%. Therefore, a full screen display may not be achieved.

Figure 3A:
FIG. 3A is a schematic front view showing a structure of a display device, according to some embodiments of the present disclosure.
Figure 3B:
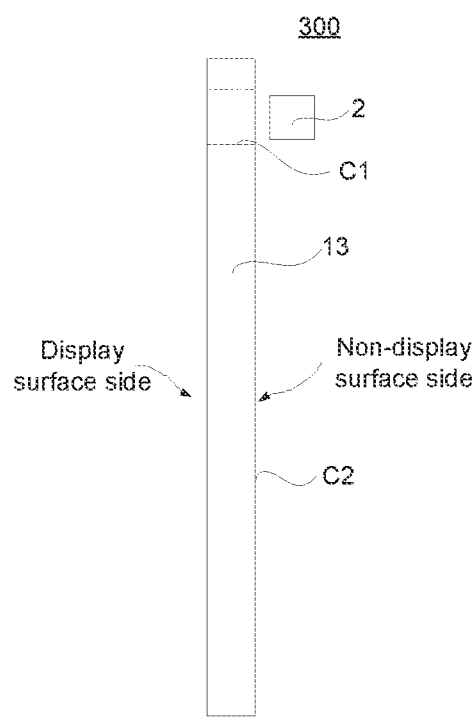
FIG. 3B is a schematic cross-sectional view of a structure taken along section line MM' of FIG. 3A.

In order to achieve a high screen-to-body ratio, in some embodiments of the present disclosure, as shown in FIGS. 3A and 3B, a display device 300 includes a display panel 13 and a sensing component 2. The display panel 13 has a sensing component region (i.e., a first region) C1 and a non-sensing component region (i.e., a second region) C2. The non-sensing component region C2 can display images. The non-sensing component region C2 may, for example, surround the sensing component region C1 or half-surround the sensing component region C1. That is, the second region is located on at least one side of the first region. The sensing component region C1 is transparent and can display images. The sensing component 2 is disposed at a non-display surface side of the display panel 13, and the sensing component 2 directly faces the sensing component region C1 of the display panel 13. That is, an orthographic projection of the sensing component 2 on the display surface of the display panel 13 is within the sensing component region C1.

A sensing surface of the sensing component 2 faces the display panel 13. Since the sensing component region C1 is transparent, the sensing component 2 may sense the light from the display surface side of the display panel 13 through the sensing component region C1, so as to perform a relevant operation. In an example where the sensing component 2 is a front camera, the front camera collects light from an object to be photographed located at the display surface side of the display panel 13 through the sensing component region C1, so as to achieve imaging and obtaining an image of the object to be photographed.

Figure 4A:
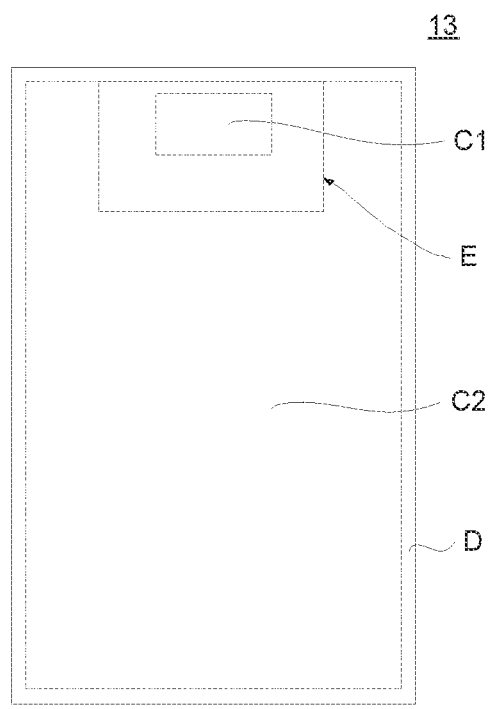
FIG. 4A is a schematic diagram showing a region division of a display panel, according to some embodiments of the present disclosure.
Figure 4B:
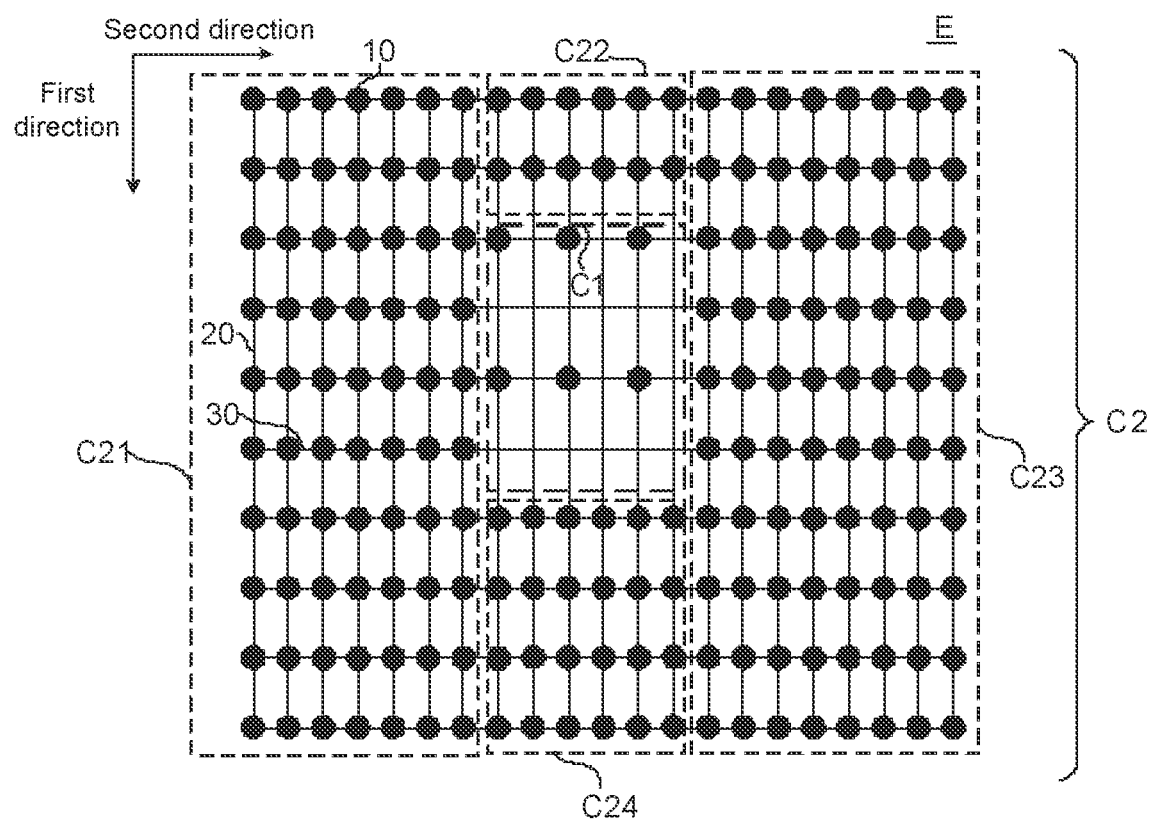
FIG. 4B is an enlarged schematic diagram showing a structure in the region E in FIG. 4A.

In order to make the sensing component region C1 have a high light transmittance, and make the sensing component 2 disposed at the non-display surface side of the display panel 13 sense more light from the display surface side of the display panel 1 through the sensing component region C1, in some embodiments, as shown in FIGS. 4A and 4B, the display panel 13 is designed as follows. A plurality of pixels 10 are provided in the display area (which includes the sensing component region C1 and the non-sensing component region C2) of the display panel 13. The plurality of pixels 10 may be, for example, arranged in an array.

In order to describe technical solutions of the present disclosure more clearly, a region E is defined in the display surface of the display panel 13, and a structure disposed in the region E is described as follows. FIG. 4B is a schematic diagram showing the structure in an enlarged region E. The region E includes a partial region of the non-sensing component region C2 and the sensing component region C1. The "partial region of the non-sensing component region C2" is a region adjacent to the sensing component region C1 and surrounding the sensing component region C1 in the non-sensing component region C2. For a structure in a region of the non-sensing component region C2 that is outside the region E, reference may be made to a structure in the partial region of the non-sensing component region C2 that is within the region E.

A manner of reducing pixels per inch (PPI) of the sensing component region C1 is used, that is, compared with the non-sensing component region C2, the number of pixels 10 in the sensing component region C1 is reduced. Therefore, in the sensing component region C1, the space occupied by the pixels 10 is reduced and space may be vacated to allow light to pass through. As a result, the sensing component region C1 has a high light transmittance.

Referring to FIG. 4B, the display area of the display panel 13 (taking the region E as an example, the region E includes the partial region of the non-sensing component region C2 and the sensing component region C1) is provided with a plurality of first wirings 20 extending in a first direction and a plurality of second wirings 30 extending in a second direction. The plurality of first wirings 20 are arranged at intervals in the second direction, and the plurality of second wirings 30 are arranged at intervals in the first direction. The first direction and the second direction intersect. For example, the first direction is a column direction in which a plurality of pixels 10 are arranged, and the second direction is a row direction in which a plurality of pixels 10 are arranged. In a case where the first direction is the column direction and the second direction is the row direction, first wiring(s) include at least one of a data line (Data line), an initialization signal line, a first power line (Vdd line) and a second power line (Vss line), and second wiring(s) include at least one of a gate line (Gate line), a control line and a common voltage signal line (Com line). Since the PPI of the non-sensing component region C2 is high, an arrangement of the first wirings 20 is dense, and a distance between two adjacent first wirings 20 is relatively small.

A density of the arrangement of the first wirings 20 in the sensing component region C1 is the same as a density of an arrangement of the first wirings 20 in the non-sensing component region C2. The reasons are as follows. For sub-pixel columns in which a plurality of pixels 10 in the sensing component region C1 are located, in these sub-pixel columns, a PPI of a region C22 of the non-sensing component region C2 and a PPI of a region C24 of the non-sensing component region C2 should be the same as a PPI of a region C21 of the non-sensing component region C2 and a PPI of a region C23 of the non-sensing component region C2, respectively. Therefore, the density of the arrangement of the first wirings 20 and the density of the arrangement of the second wirings 30 in the region C22 and the region C24 of the non-sensing component region C2 should be the same as the density of the arrangement of the first wirings 20 and the density of the arrangement of the second wirings 30 in the region C21 and the region C23 of the non-sensing component region C2, respectively. As a result, a density of an arrangement of wirings of these sub-pixel columns in the sensing component region C1 may not be reduced due to a reduction of the PPI thereof.

In this way, in a process where light passes through the sensing component region C1 (that is, in the process where the light propagates from the display surface side of the display panel 13 to the sensing component 2), because an arrangement of the plurality of first wirings 20 in the sensing component region C1 is dense, and the distance between two adjacent first wirings 20 is small, a diffraction phenomenon may occur when light propagates through a gap between the two adjacent first wirings 20, which may affect accuracy of information of light sensed by the sensing component. The diffraction phenomenon of light refers to a phenomenon that when light meets a barrier or a pinhole during a propagation process of the light, the light will deviate from a path of rectilinear propagation and travel to a back side of the barrier. The smaller the gap between barriers, or the smaller the pinhole, the more obvious the diffraction phenomenon. In a case where the dimension of the pinhole is as small as a wavelength of the light, the diffraction phenomenon of light is extremely serious. The more obvious the diffraction phenomenon that occurs when the light propagates, the darker the light.

In an example where the sensing component 2 is the front camera, when the front camera captures an image through the sensing component region C1 of the display panel 13, the front camera needs to collect light from an object to be photographed disposed at the display surface side of the display panel 13 through the sensing component region C1. However, because the arrangement of the first wirings 20 is dense, and the diffraction of light occurs when the light passes through the sensing component region C1, the information of the light collected by the front camera is not accurate, and then the imaging effect of the front camera is reduced. For example, the brightness of an image is low, and the definition of the image is poor.

Figure 5A:
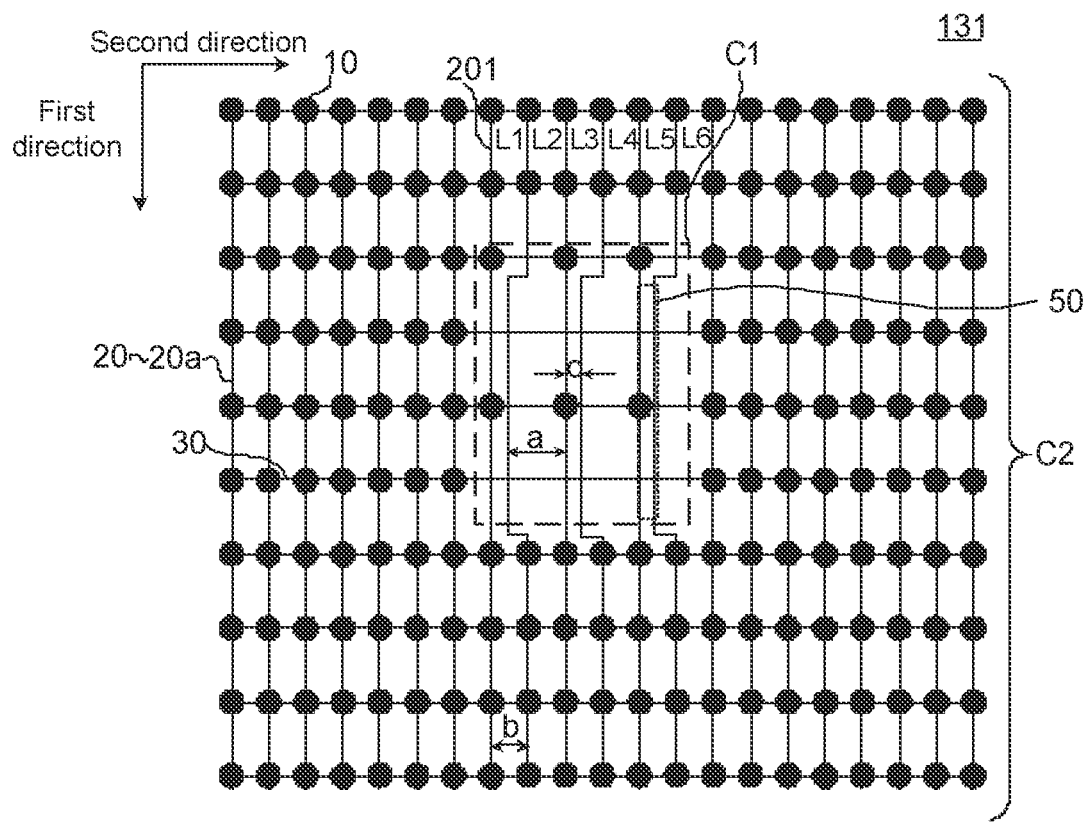
FIG. 5A is a schematic diagram showing a structure of an array substrate, according to some embodiments of the present disclosure.
Figure 5B:
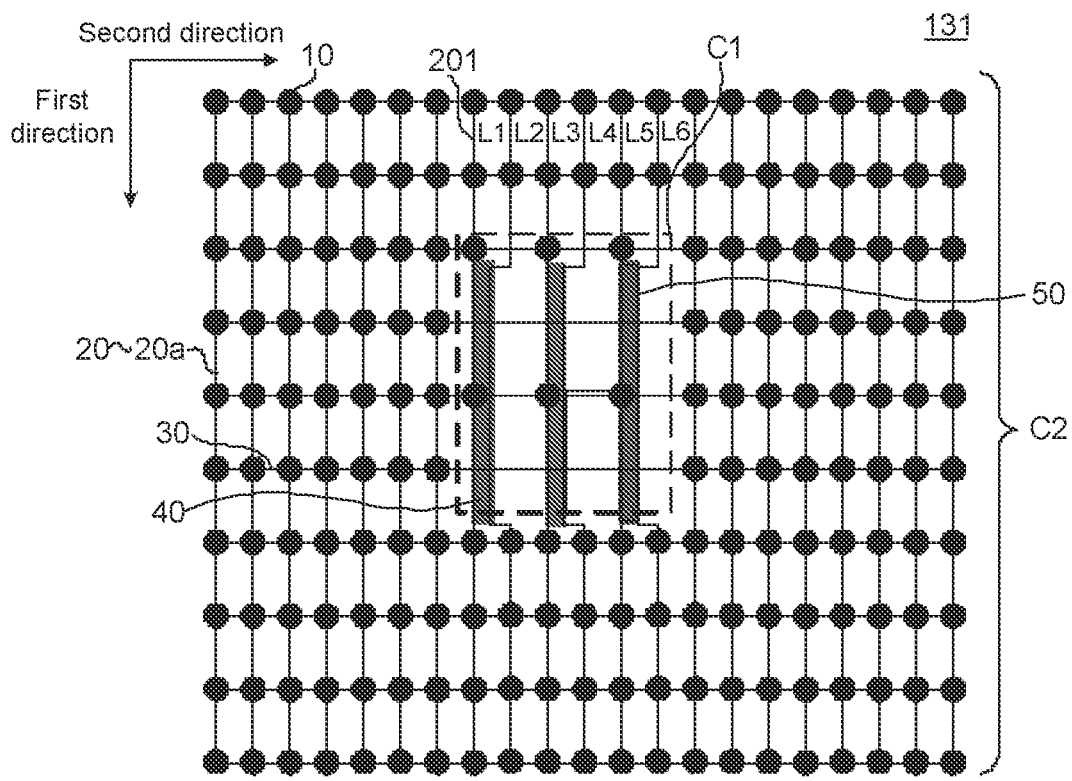
FIG. 5B is a schematic diagram showing another structure of an array substrate, according to some embodiments of the present disclosure.

On the basis of the above, as shown in FIGS. 5A and 5B, some embodiments of the present disclosure provide an array substrate 131. The array substrate 131 has a non-sensing component region C2 and a transparent sensing component region C1. The sensing component region C1 and the non-sensing component region C2 both have display function. The non-sensing component region C2 may, for example, surround the sensing component region C1 or half surround the sensing component region C1.

The array substrate 131 has the non-sensing component region C2 and the transparent sensing component region C1, and in a case where the array substrate 131 is applied to a display device including the sensing component 2, light may pass through the transparent sensing component region C1 (that is, the light may propagate from a display surface side of the array substrate 131 to the sensing component 2). That is, light from the display surface side may pass through the sensing component region C1 and be sensed by the sensing component 2.

The array substrate 131 includes a plurality of first wirings 20 extending in the first direction. The plurality of first wirings 20 are arranged at intervals. Wirings passing through the sensing component region C1 in the plurality of first wirings 20 are selected first wirings 201. The selected first wirings 201 are divided into at least one group of selected first wirings, e.g., a plurality of groups of selected first wirings (i.e., a plurality of first wiring groups). Each group of selected first wirings includes at least two adjacent selected first wirings 201. Selected first wirings 201 in each group of selected first wirings are gathered in the sensing component region C1 to form a first gathering portion 50.

For example, as shown in FIG. 5A, first wirings numbered $L_1$ to $L_6$ are selected first wirings 201. The selected first wirings 201 may be divided into three groups. Each group of selected first wirings includes two adjacent selected first wirings 201. Two selected first wirings 201 included in each group of selected first wirings are gathered in the sensing component region C1 to form a first gathering portion 50. Therefore, three groups of selected first wirings 201 are respectively gathered in the sensing component region C1 to form three first gathering portions 50.

For example, with continued reference to FIG. 5A, the selected first wirings 201 numbered $L_1$ and $L_2$ are taken as a group of selected first wirings, which are gathered in the sensing component region C1 to form a first gathering portion 50. The selected first wirings 201 numbered $L_3$ and $L_4$ are taken as a group of selected first wirings, which are gathered in the sensing component region C1 to form a first gathering portion 50. The selected first wirings 201 numbered $L_5$ and $L_6$ are taken as a group of selected first wirings, which are gathered in the sensing component region C1 to form a first gathering portion 50. Considering the selected first wirings 201 numbered $L_1$ and $L_2$ as an example, the selected first wiring 201 numbered $L_2$ includes a first portion extending in the first direction and second portions extending in the second direction. The first portion and the second portions are alternately arranged in sequence and joined end to end. In this structure, the selected first wiring 201 numbered $L_2$ is made closer to the selected first wiring 201 numbered $L_1$ in the sensing component region C1 to form the first gathering portion 50. It will be understood that the first gathering portion 50 includes a portion of the selected first wiring 201 numbered $L_1$ located in the sensing component region C1 and a portion of the selected first wiring 201 numbered $L_2$ located in the sensing component region C1. Structures of the other two first gathering portions 50 are similar to the structure of the aforesaid first gathering portion 50, and details are not described here again.

A part of the selected first wirings 201 in each group of selected first wirings are electrically connected to a part of pixels located in the sensing component region C1, and another part of the selected first wirings 201 in the group of selected first wirings are electrically connected to a part of pixels located in the non-sensing component region C2 and are not electrically connected to the pixels located in the sensing component region C1.

As shown in FIGS. 5B to 6C, the array substrate 131 further includes at least one light-shielding strip 40 disposed in the sensing component region C1. The at least one first light-shielding strip 40 is disposed on a side of the plurality of selected first wirings 201 away from or proximate to the display surface side of the array substrate 131. An orthographic projection of each first gathering portion 50 on the display surface of the array substrate 131 (i.e., a surface of the array substrate 131 configured to display images in a case where the array substrate 131 is applied to a display panel) is within an orthographic projection of a corresponding first light-shielding strip 40 on the display surface.

Embodiments of the present disclosure do not limit a position of the at least one first light-shielding strip 50 relative to the plurality of first wirings 20, as long as the orthographic projection of each first gathering portion 50 on the display surface of the array substrate 131 is within the orthographic projection of the corresponding first light-shielding strip 40 on the display surface. In this way, gap(s) between at least two adjacent selected first wirings 201 in the first gathering portion 50 may be blocked by the first light-shielding strip 40, so as to avoid the diffraction of light when the light passes through the gap(s) between the selected first wirings 201 in the first gathering portion 50.

Figure 6A:
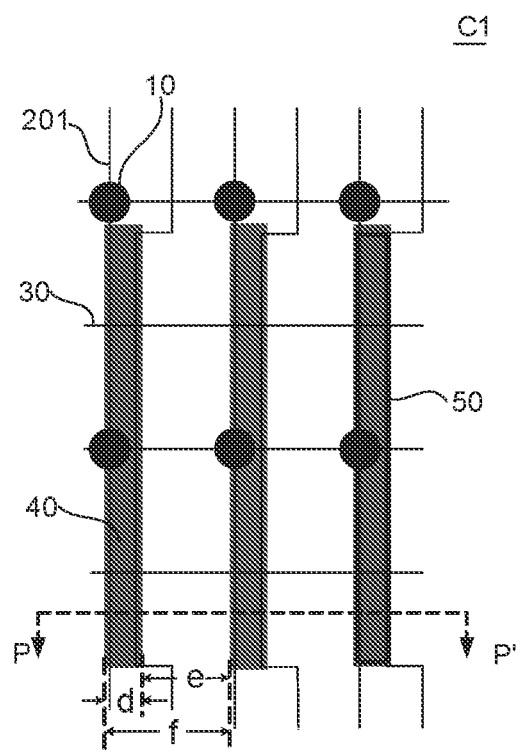
FIG. 6A is an enlarged schematic diagram showing a structure in the sensing component region C1 in FIG. 5B.
Figure 6B:
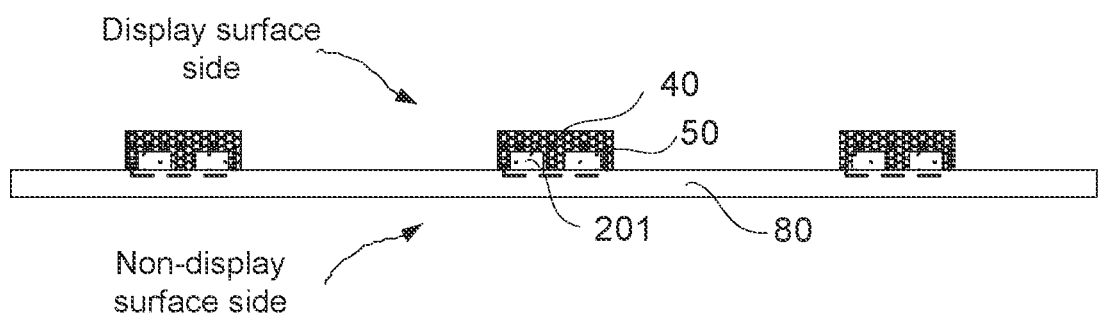
FIG. 6B is a schematic cross-sectional view of a structure taken along section line PP' of FIG. 6A.
Figure 6C:
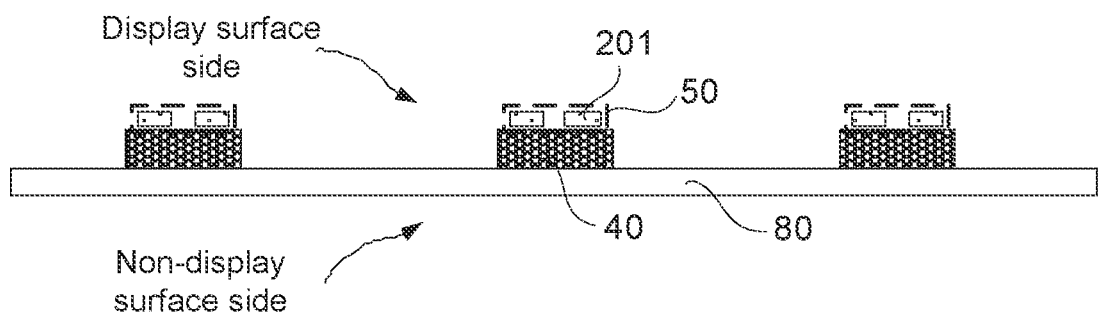
FIG. 6C is a schematic cross-sectional view of another structure taken along the section line PP' of FIG. 6A.

For example, FIG. 6B shows a case where the at least one first light-shielding strip 40 is disposed on a side of the plurality of selected first wirings 201 proximate to the display surface side of the array substrate 131, and the at least one first light-shielding strip 40 is disposed on a side of the plurality of selected first wirings 201 away from a base substrate 80. FIG. 6C shows a case where the at least one first light-shielding strip 40 is disposed on a side of the plurality of selected first wirings 201 away from the display surface side of the array substrate 131, and the at least one first light-shielding strip 40 is disposed on a side of the plurality of selected first wirings 201 proximate to the base substrate 80.

In some embodiments, as shown in FIG. 6B, the at least one first light-shielding strip 40 is disposed on the side of the plurality of selected first wirings 201 proximate to the display surface side of the array substrate 131, and the at least one first light-shielding strip 40 is disposed on the side of the plurality of selected first wirings 201 away from the base substrate 80. In this way, a process for forming the first light-shielding strip 40 may be included in a process for forming a light-shielding pattern for shielding an active layer of a thin film transistor in the array substrate 131. It is not necessary to additionally provide the process for forming the first light-shielding strip 40, which simplifies a process for manufacturing the array substrate 131.

Referring to FIG. 5B, the at least one first light-shielding strip 40 is disposed on the side of the plurality of selected first wirings 201 away from or proximate to the display surface side of the array substrate 131. The orthographic projection of each first gathering portion 50 on the display surface is within the orthographic projection of the first light-shielding strip 40 on the display surface. That is, the number of the first light-shielding strips 50 is the same as the number of the first gathering portions 50.

In the array substrate 131 provided by the embodiments of the present disclosure, the selected first wirings 201 passing through the sensing component region C1 are divided into groups. Each group of selected first wirings includes at least two adjacent selected first wirings 201, and selected first wirings 201 in each group of selected first wirings are gathered to form the gathering portion 50 in the sensing component region C1. That is, selected first wirings 201 in each group of selected first wirings are made closer to each other in the sensing component region C1. In this way, two adjacent selected first wirings 201 in each group of selected first wirings are close together in the sensing component region C1, and two adjacent first gathering portions 50 are further away from each other. A distance between the two adjacent first gathering portions 50 is greater than a distance between two adjacent first wirings 20 in the non-sensing component region C2.

In addition, the gap(s) between at least two adjacent selected first wirings 201 in the first gathering portion 50 are blocked by at least one first light-shielding strip 40, which prevents light from passing through the gap(s), and avoids the diffraction phenomenon of light when the light passes through the gap(s) between at least two adjacent selected first wirings 201 in the first gathering portion 50.

In this way, in a case where the light passes through the transparent sensing component region C1 of the array substrate 131, the light passes through a region between the two adjacent first light-shielding strips 40. The distance between two adjacent first gathering portions 50 is greater than the distance between two adjacent first wirings 20 in the non-sensing component region C2. That is, in the transparent sensing component region C1, compared with a density of an arrangement of the plurality of first wirings 20 before gathering, a density of an arrangement of the plurality of first gathering portions 50 (which is equivalent to a density of an arrangement of the plurality of first light-shielding strips 40) formed by gathering selected first wirings 201 in each group of selected first wirings is smaller. Therefore, when light passes through the transparent sensing component region C1, the diffraction phenomenon is alleviated, and influence of the diffraction of light on brightness of the light is reduced. Thereby, the accuracy of the information of the light sensed by the sensing component 2 is improved.

In an example where the sensing component 2 is the front camera, when the light passes through the transparent sensing component region C1, the diffraction phenomenon of light is alleviated. Therefore, imaging effect of the front camera is improved, and the brightness and definition of an obtained image are significantly improved.

In some embodiments, with continued reference to FIG. 5A, in the transparent sensing component region C1 of the array substrate 131, a distance a between two adjacent first gathering portions 50 is greater than a distance b between two adjacent first wirings in the non-sensing component region C2. A distance c between two adjacent selected first wirings 201 in each first gathering portion 50 is less than the distance b between the two adjacent first wirings in the non-sensing component region C2.

In the embodiments, the distance a between two adjacent first gathering portions 50 is greater than the distance b between two adjacent first wirings 20 in the non-sensing component region C2. The distance a between two adjacent first gathering portions 50 is a distance between two nearest selected first wirings 201 that are respectively located in two adjacent first gathering portions 50. In this way, compared with the distance b between two adjacent first wirings 20 in the non-sensing component region C2, the distance a between two adjacent first gathering portions 50 becomes larger. Correspondingly, the distance between two adjacent first light-shielding strips 40 is greater than the distance between two adjacent first wirings 20 in the non-sensing component region C2, so that the diffraction phenomenon of light is alleviated when the light passes through the transparent sensing component region C1.

In addition, the distance c between two adjacent selected first wirings 201 in each first gathering portion 50 is less than the distance b between the two adjacent first wirings 20 in the non-sensing component region C2. In this way, in each first gathering portion 50, two adjacent selected first wirings 201 are made closer to each other, so that a dimension of the first gathering portion 50 in a direction perpendicular to an extending direction of the first gathering portion 50 (i.e., a width of the first gathering portion 50) is small. Therefore, the distance between two adjacent first gathering portions 50 is large. In this case, the diffraction phenomenon of light is alleviated, and a width of the first light-shielding strip 40 for shielding gap(s) between at least two adjacent selected first wirings 201 in the first gathering portion 50 is small, so that more light may be allowed to pass through the sensing component region C1.

In some embodiments, the number of selected first wirings 201 included in each group of selected first wirings is not limited. Each group of selected first wirings may include two selected first wirings 201, which is shown in FIGS. 5A, 5B, and 6A to 6C. Each group of selected first wirings may include more than two selected first wirings 201. For example, the number of selected first wirings 201 included in each group of selected first wirings is three, four or five.

In some embodiments, the number of selected first wirings 201 included in each group of selected first wirings is equal.

For example, the number of selected first wirings 201 included in each group of selected first wirings is two, or the number of selected first wirings 201 included in each group of selected first wirings is three or four or other numbers. FIG. 5A shows a case where each group of selected first wirings includes two selected first wirings 201. In this way, widths of the plurality of first gathering portions 50 corresponding to the plurality of groups of selected first wirings are equal or approximately equal, and widths of the first light-shielding strips 40 are equal or approximately equal. Therefore, in each position of the sensing component region C1, reduction degree of the diffraction of light is equal or approximately equal. Light passing through each position of the sensing component region C1 is uniform, so that the accuracy of the information of the light sensed by the sensing component 2 is improved.

In some embodiments, a distance between any two adjacent first gathering portions 50 is equal. A distance between any two adjacent selected first wirings 201 in each first gathering portion 50 is equal.

For example, as shown in FIG. 5A, the distance between any two adjacent first gathering portions 50 is a. In a case where each group of selected first wirings includes three or more selected first wirings 201, the distance between any two adjacent selected first wirings 201 in each first gathering portion 50 is equal.

In this design, because the distance between any two adjacent first gathering portions 50 is equal, a distance between any two adjacent first light-shielding strips 40 is equal or approximately equal. The distance between any two adjacent selected first wirings 201 in each first gathering portion 50 is equal, so that the widths of the plurality of first gathering portions 50 are equal, and the widths of the plurality of first light-shielding strips 40 are equal or approximately equal. In this way, in every position of the sensing component region C1, the reduction degree of the diffraction of light is equal or approximately equal, and the light passing through every position of the sensing component region C1 is more uniform. Therefore, the accuracy of the information of the light sensed by the sensing component 2 is improved.

In some embodiments of the present disclosure, by setting the width of the first light-shielding strip 40 and the distance between two adjacent first light-shielding strips 40 within respective appropriate ranges, the diffraction phenomenon of light may be further alleviated.

It will be noted that, as shown in FIG. 6A, a width d of the first light-shielding strip 40 refers to a dimension of the first light-shielding strip 40 in a direction perpendicular to the extending direction of the first light-shielding strip 40. A distance e between two adjacent first light-shielding strips 40 refers to a distance between two adjacent first light-shielding strips 40 in a direction perpendicular to the extending direction of the first light-shielding strips 40. For example, in a case where the extending direction of the first light-shielding strip 40 is the first direction, the width d of the first light-shielding strip 40 refers to a dimension of the first light-shielding strip 40 in a direction perpendicular to the first direction, and the distance e between two adjacent first light-shielding strips 40 refers to a distance between two adjacent first light-shielding strips 40 in the direction perpendicular to the first direction.

In addition, by setting the width of the first gathering portion 50, the distance between two adjacent first gathering portions 50 and the number of selected first wirings 201 of a group of selected first wirings corresponding to each first gathering portion 50, the width of the first light-shielding strip 40 and the distance between two adjacent first light-shielding strips 40 may be set.

It is assumed that a lower limit value of the distance e between two adjacent first light-shielding strips 40 is e1, and an upper limit value of the distance e between two adjacent first light-shielding strips 40 is e2. The distance e between two adjacent first light-shielding strips 40 is greater than or equal to the lower limit value e1, so that when light passes through gap(s) between the plurality of first light-shielding strips 40, the diffraction phenomenon of light that is caused by a small distance e between two adjacent first light-shielding strips 40 may be avoided. The distance e between two adjacent first light-shielding strips 40 is less than or equal to the upper limit value e2, so that a problem that the number of the first light-shielding strips 40 is small due to a large distance e between two adjacent first light-shielding strips 40 may be avoided (in a case where an area of the sensing component region C1 is constant, if the distance e between two adjacent first light-shielding strips 40 is too large, the number of the first light-shielding strips 40 is reduced), and a problem that the number of the first gathering portions 50 corresponding to the first light-shielding strips 40 is reduced may also be avoided. As for the array substrate 131, the number of the first wirings 20 is constant, and the number of the selected first wirings 201 passing through the sensing component region C1 is also constant. If the number of the first light-shielding strips is reduced, the number of selected first wirings 201 in a group corresponding to each first gathering portion 50 is large, so that selected first wirings in each group of selected first wirings may interact, and signals transmitted thereon may fluctuate and be inaccurate.

In addition, it is assumed that a lower limit value of the width d of the first light-shielding strip 40 is d1, and an upper limit value of the width d of the first light-shielding strip 40 is d2. The width d of the first light-shielding strip 40 is greater than or equal to the lower limit value d1, so that a problem that a gap between two adjacent selected first wirings 201 in the first gathering portion 50 may not be effectively shielded because the width d of the first light-shielding strip 40 is too small is avoided. The width d of the first light-shielding strip 40 is less than or equal to the upper limit value d2, so that a problem of the diffraction phenomenon of light that is caused by a small distance e between two adjacent first light-shielding strips 40 which is caused by a large width d of the first light-shielding strip 40 may be avoided, and a problem that the amount of the light passing through the sensing component region C1 is reduced may be also avoided.

On this basis, in some embodiments, a ratio of the width d of the first light-shielding strip 40 to the distance e between two adjacent first light-shielding strips 40 is greater than 0, and less than or equal to 0.5. For example, the ratio of the width d of the first light-shielding strip 40 to the distance e between two adjacent first light-shielding strips 40 may be ½, 7.5/16.125, etc.

For example, in a case where the ratio of the width d of the first light-shielding strip 40 to the distance e between two adjacent first light-shielding strips 40 is greater than 0, and less than or equal to 0.5, a sum f of the width d of the first light-shielding strip 40 and the distance e between two adjacent first light-shielding strips 40 is greater than or equal to 94.5 μm, and less than or equal to 200 μm. For example, the sum f of the width d of the first light-shielding strip 40 and the distance e between two adjacent first light-shielding strips 40 may be 94.5 μm, 100 μm, 200 μm, etc.

It will be noted that two opposite sides of the first light-shielding strip 40 in the second direction may exceed borders defined by two outermost selected first wirings 201 in the corresponding first gathering portion 50 (that is, in the second direction, two opposite borders of the first light-shielding strip 40 may exceed two selected first wirings 201 located at two ends of the corresponding group of selected first wirings, respectively), or may also be aligned with the borders defined by the two outermost selected first wirings 201 in the corresponding first gathering portion 50.

In the embodiments of the present disclosure, the ratio of the width d of the first light-shielding strip 40 to the distance e between two adjacent first light-shielding strips 40 is greater than 0, and less than or equal to 0.5, and the sum f of the width d of the first light-shielding strip 40 and the distance e between two adjacent first light-shielding strips 40 is greater than or equal to 94.5 μm, and less than or equal to 200 μm. In this case, it may ensure that the diffraction phenomenon of light is further alleviated when the light passes through the sensing component region C1, so that the information of the light sensed by the sensing component 2 is more accurate.

In a case where the sensing component 2 is the front camera, the inventors of the present disclosure have verified through experiments that, if the ratio of the width d of the first light-shielding strip 40 to the distance e between two adjacent first light-shielding strips 40 is set to 7.5/16.125, and the sum of the width d of the first light-shielding strip 40 and the distance e between two adjacent first light-shielding strips 40 is set to 94.5 μm, when the front camera captures an image, the diffraction phenomenon of light is effectively alleviated, and the definition of the captured image is high.

In the array substrate 131 provided by some embodiments of the present disclosure, along the extending direction of the first light-shielding strip 40, there are some places where thin film transistors are provided, and there are some places where thin film transistors are not provided. Therefore, in a design of the first light-shielding strip 40, in some embodiments, the width of the first light-shielding strip 40 is different along the extending direction of the first light-shielding strip 40. For example, in the place where the thin film transistor is provided, a width of the first light-shielding strip 40 is large, and in the place where the thin film transistor is not provided, a width of the first light-shielding strip 40 is small. In this way, at the place where the width of the first light-shielding strip 40 is small, a distance between two adjacent first light-shielding strips 40 is increased, so that more light may pass through the sensing component region C1 to be sensed by the sensing component 2.

It will be noted that in a case where the width of the first light-shielding strip 40 is different along the extending direction of the first light-shielding strip 40, the distance e between two adjacent first light-shielding strips 40 refers to a distance between two adjacent first light-shielding strips 40 at a same position in a direction perpendicular to the extending direction of the first light-shielding strips 40.

In some embodiments, the width of the same first light-shielding strip 40 is equal everywhere along the extending direction of the first light-shielding strip 40. In this way, the process of forming the first light-shielding strip 40 may be simplified, and manufacturing efficiency may be improved. In some examples, in the case where the width of the first light-shielding strip 40 is equal everywhere, the distance between two adjacent first light-shielding strips 40 may be equal or different along the second direction. In some examples, in the case where the width of the same first light-shielding strip 40 is equal everywhere, widths of the plurality of first light-shielding strips 40 are equal. In this way, in a case where the first light-shielding strip 40 is formed, the process may be simplified and difficulty of the process may be reduced.

In the case where the widths of the plurality of first light-shielding strips 40 are equal, the number of the plurality of selected first wirings 201 corresponding to each first gathering portion 50 may be set to be equal, and the distance between any two adjacent selected first wirings 201 in each group of selected first wirings may be set to be equal. In this way, a degree of interaction among the plurality of selected first wirings 201 in each group of selected first wirings is the same, so that influence of the plurality of groups of selected first wirings 201 in the sensing component region C1 on light passing through the sensing component region C1 is the same. Thereby, the accuracy of the information of light collected by the sensing component 2 is improved.

Figure 7:
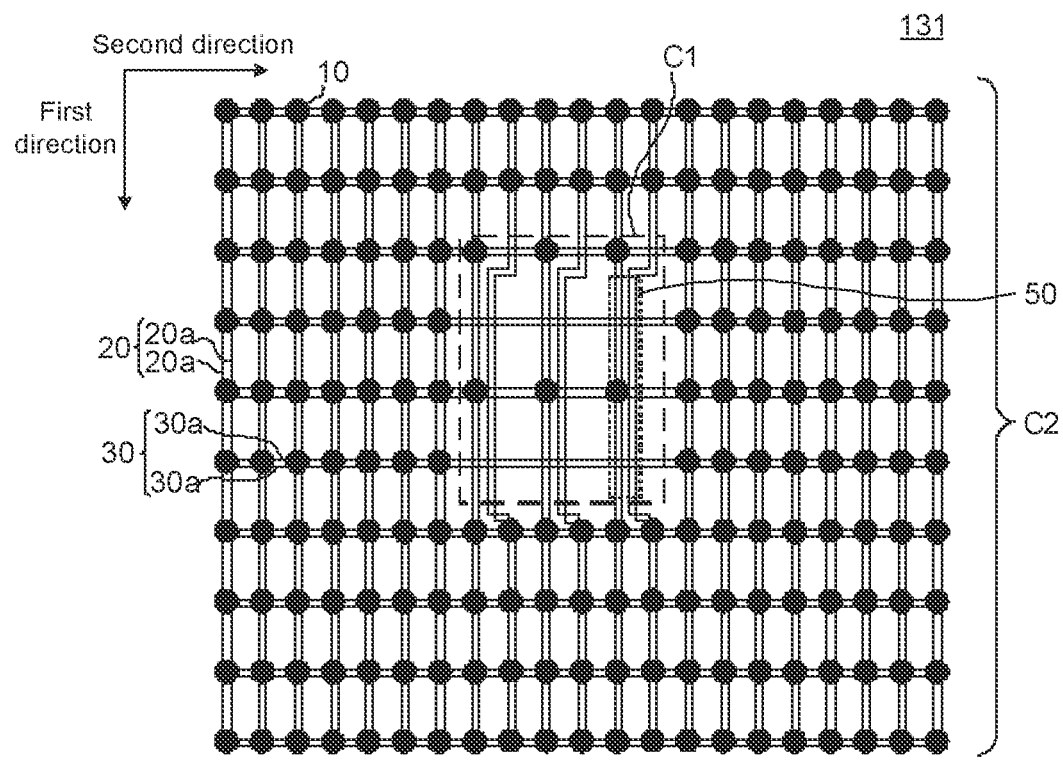
FIG. 7 is a schematic diagram showing yet another structure of an array substrate, according to some embodiments of the present disclosure.

In some embodiments, a first wiring 20 includes one or more first sub-wirings 20a. For example, as shown in FIG. 5A, the first wiring 20 includes one first sub-wiring 20a. As shown in FIG. 7, the first wiring 20 includes two first sub-wirings 20a. In a case where the first wiring 20 includes a plurality of first sub-wirings 20a, two adjacent first sub-wirings 20a are at intervals. Since the selected first wirings 201 are wirings passing through the sensing component region C1 in the plurality of first wirings 20 in the array substrate 131, the aforementioned embodiments are also suitable for each selected first wiring 201.

In some embodiments, in a case where the first direction is a column direction, the first sub-wiring 20a(s) included in the first wiring 20 are at least one of a data line, an initialization signal line, a first power line (Vdd line), a second power line (Vss line), and the like. In some other embodiments, in a case where the first direction is a row direction, the first sub-wiring 20a(s) included in the first wiring 20 are at least one of a gate line, a control line, a common voltage signal line, and the like. Since the selected first wirings 201 are wirings passing through the sensing component region C1 in the plurality of first wirings 20 in the array substrate 131, the aforementioned embodiments are also suitable for each selected first wiring 201.

In some embodiments, in a case where a first wiring 20 includes a plurality of first sub-wirings 20a, types of the first sub-wirings 20a included in the first wiring 20 may be the same or different. For example, the first wiring 20 includes two data lines. For another example, the first wiring 20 includes one data line and one Vdd line. Since the selected first wirings 201 are wirings passing through the sensing component region C1 in the plurality of first wirings 20 in the array substrate 131, the aforementioned embodiments are also suitable for each selected first wiring 201.

In some embodiments, a column of sub-pixels is coupled to a first sub-wiring 20a. In this case, if a pixel 10 includes at least one sub-pixel, a column of pixels corresponds to at least one first sub-wiring. For example, as shown in FIG. 5A, the pixel 10 includes a sub-pixel, and the column of pixels corresponds to one first sub-wiring 20a. For another example, as shown in FIG. 7, the pixel 10 includes two sub-pixels, and the column of pixels corresponds to two first sub-wirings 20a. For yet another example, the pixel 10 includes three sub-pixels, and the column of pixels corresponds to three first sub-wirings 20a. Since the selected first wirings 201 are wirings passing through the sensing component region C1 in the plurality of first wirings 20 in the array substrate 131, the aforementioned embodiments are also suitable for each selected first wiring 201.

For example, in a case where a column of sub-pixels is coupled to one first wiring 20, the number of sub-pixels included in a pixel 10 is related to the number of data lines included in the first wiring 20 to which the pixel 10 is coupled. For example, if the pixel 10 includes one sub-pixel, the first wiring 20 coupled to the pixel 10 includes one data line. If the pixel 10 includes two sub-pixels, the first wiring 20 coupled to the pixel 10 includes two data lines. If the pixel 10 includes three sub-pixels, the first wiring 20 coupled to the pixel 10 includes three data lines.

On the above basis, with continued reference to FIG. 7, in a case where a column of pixels corresponds to at least two first sub-wirings 20a, in the columns of pixels in the sensing component region C1, first sub-wirings 20a corresponding to a same column of pixels may be gathered in a same gathering portion 50. In this way, distribution of wirings in the sensing component region C1 is more regular, and the degree of the diffraction of light passing through the region is further alleviated.

With continued reference to FIG. 4B, the array substrate further includes a plurality of second wirings 30 in the second direction. The second direction intersects with the first direction. In the sensing component region C1, an arrangement of the plurality of second wirings 30 extending in the second direction is dense, and a distance between two adjacent second wirings 30 is small. Especially for a display device having a high PPI, a density of the arrangement of the second wirings 30 is larger. In this way, during a process of light passing through the sensing component region C1 (that is, during the process of the light propagating from the display surface side of the display panel 13 to the sensing component 2), since the distance between two adjacent second wirings 30 is small, the diffraction phenomenon may occur when the light passes through the gap between two adjacent second wirings 30. Therefore, the accuracy of the information of light sensed by the sensing component 2 may be affected.

Figure 8A:
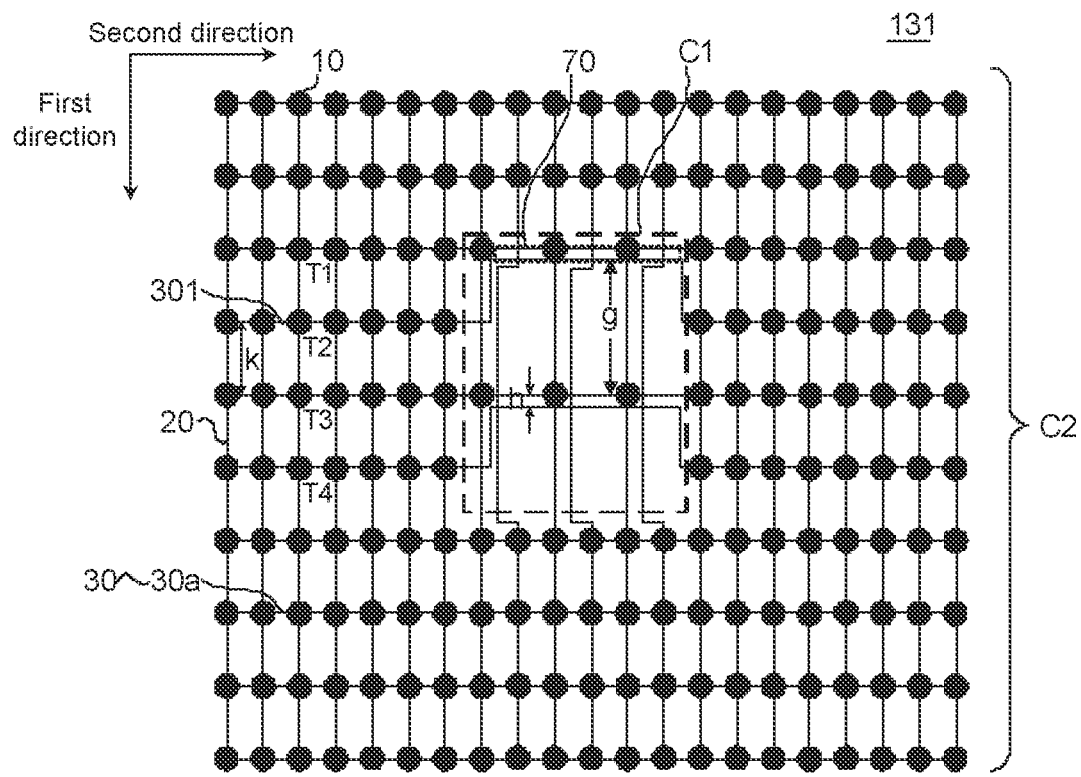
FIG. 8A is a schematic diagram showing yet another structure of an array substrate, according to some embodiments of the present disclosure.
Figure 8B:
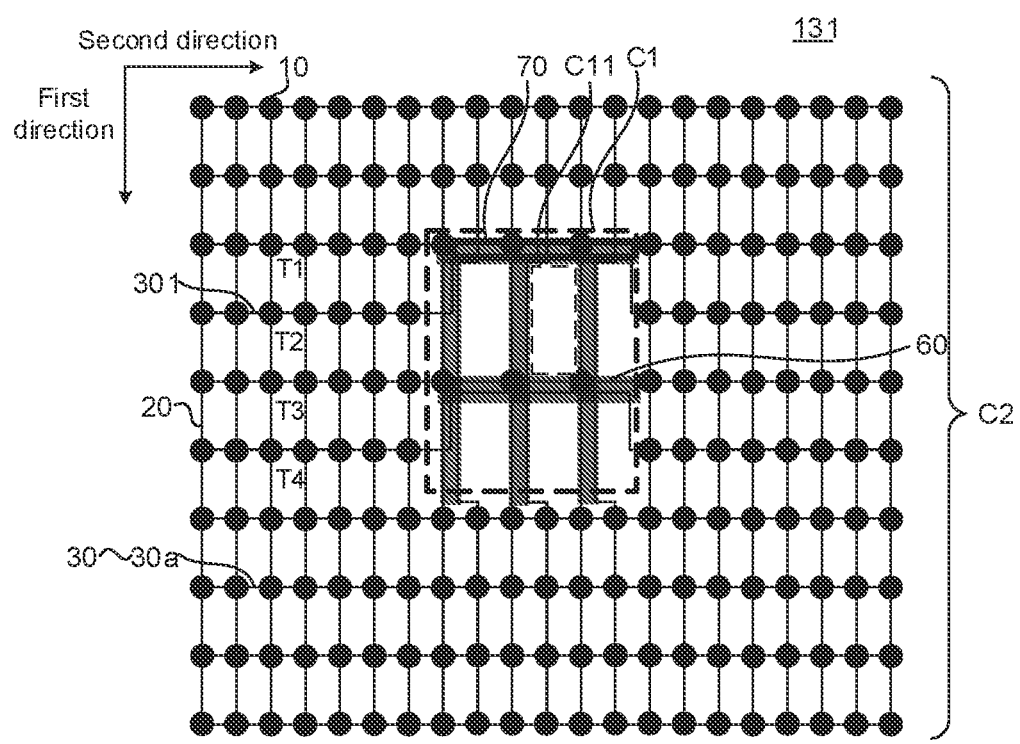
FIG. 8B is a schematic diagram showing yet another structure of an array substrate, according to some embodiments of the present disclosure.

On this basis, in some embodiments, as shown in FIGS. 8A and 8B, the array substrate 131 provided in the embodiments of the present disclosure further includes a plurality of second wirings 30 extending in the second direction and at least one second light-shielding strip 60. The first direction and the second direction intersect. For example, the first direction and the second direction are perpendicular to each other. For another example, an angle between the first direction and the second direction is an acute angle. The accompanying drawings provided herein show an example in which the first direction and the second direction are perpendicular to each other.

The plurality of second wirings 30 are arranged at intervals. Wirings passing through the sensing component region C1 in the plurality of second wirings 30 are selected second wirings 301. The selected second wirings 301 are divided into at least one group of selected second wirings, e.g., a plurality of groups of selected second wirings (i.e., a plurality of second wiring groups). Each group of selected second wirings includes at least two adjacent selected second wirings 301. Selected second wirings 301 in each group of selected second wirings are gathered in the sensing component region C1 to form a second gathering portion 70.

For example, as shown in FIG. 8A, second wirings numbered $T_1$ to $T_4$ are selected second wirings 301. The selected second wirings 301 may be divided into two groups. Each group of selected second wirings includes two adjacent selected second wirings 301. Two selected second wirings 301 included in each group of selected second wirings are gathered in the sensing component region C1 to form the second gathering portion 70. Two groups of selected second wirings 301 in the sensing component region C1 form two second gathering portions 70.

For example, with continued reference to FIG. 8A, the selected second wirings 301 numbered $T_1$ and $T_2$ are a group of selected second wirings, which are gathered in the sensing component region C1 to form one second gathering portion 70. The selected second wirings 301 numbered $T_3$ and $T_4$ are a group of selected second wirings, which are gathered in the sensing component region C1 to form one second gathering portion 70. Considering the selected second wirings 301 numbered $T_1$ and $T_2$ as an example, the selected second wiring 301 numbered $T_2$ includes a first portion extending in the second direction and second portions extending in the first direction. The first portion and the second portions are alternately arranged in sequence and joined end to end. In this structure, the selected second wiring 301 numbered $T_2$ is made closer to the selected second wiring 301 numbered $T_1$ in the sensing component region C1 to form the second gathering portion 70. It will be understood that the second gathering portion 70 includes a portion of the selected second wiring 301 numbered $T_1$ that is located in the sensing component region C1 and a portion of the selected second wiring 301 numbered $T_2$ that is located in the sensing component region C1. A structure of the other second gathering portion 70 is similar to the structure of the aforesaid second gathering portion 70, and details are not described herein again.

A part of the selected second wirings 301 in each group of selected second wirings are electrically connected to a part of pixels located in the sensing component region C1, and another part of the selected second wirings 301 in the group of selected second wirings are electrically connected to a part of pixels located in the non-sensing component region C2 and are not electrically connected to the pixels located in the sensing component region C1.

As shown in FIGS. 8B to 9C, at least one second light-shielding strip 60 is disposed at a side of the plurality of selected second wirings 301 away from or proximate to the display surface side of the array substrate 131. An orthographic projection of each second gathering portion 70 on the display surface (i.e., the surface of the array substrate 131 configured to display images in the case where the array substrate 131 is applied to the display panel) is within an orthographic projection of a corresponding second light-shielding strip 60 on the display surface.

Embodiments of the present disclosure do not limit a position of the at least one second light-shielding strip 60 relative to the plurality of second wirings 30, as long as the orthographic projection of each second gathering portion 70 on the display surface of the array substrate 131 is within the orthographic projection of the corresponding second light-shielding strip 60 on the display surface. In this way, gap(s) between at least two adjacent selected second wirings 301 in the second gathering portion 70 may be blocked by the second light-shielding strip 60, so as to avoid the diffraction of light when the light passes through the gap(s) between the selected second wirings 301 in the second gathering portion 70.

Figure 9A:
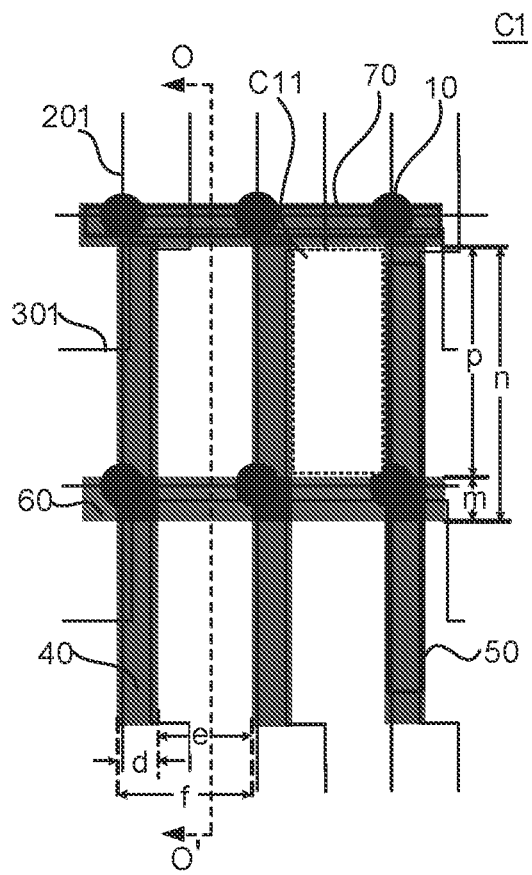
FIG. 9A is an enlarged schematic diagram showing a structure in the sensing component region C1 in FIG. 8B.
Figure 9B:
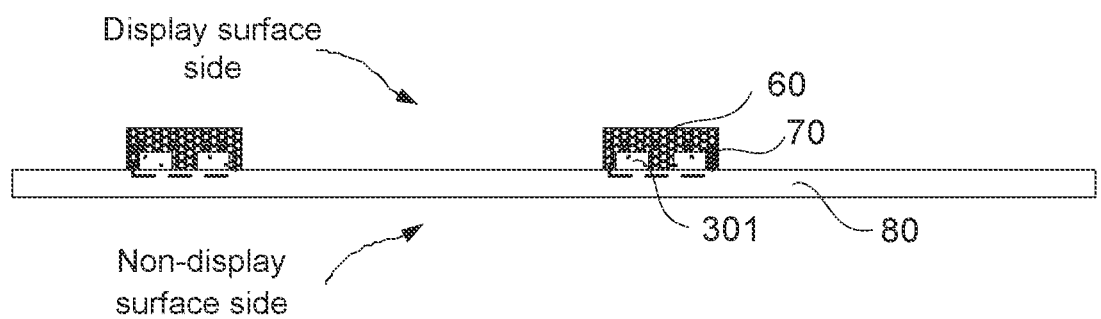
FIG. 9B is a schematic cross-sectional view of a structure taken along section line OO' of FIG. 9A.
Figure 9C:
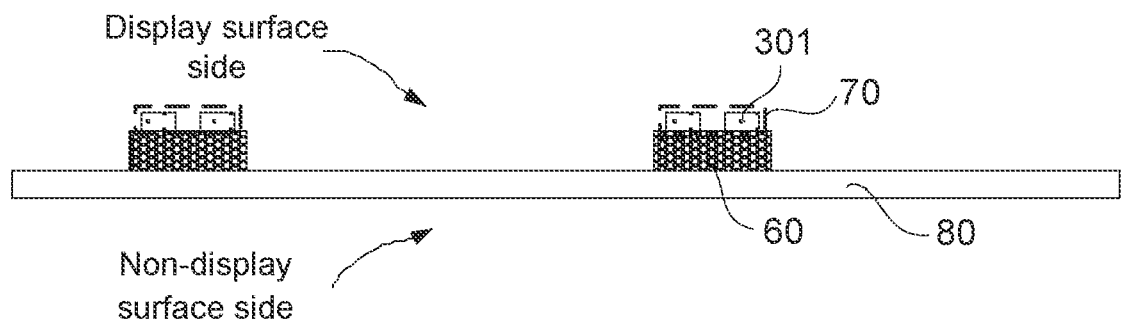
FIG. 9C is a schematic cross-sectional view of another structure taken along the section line OO' of FIG. 9A.

For example, FIG. 9B shows a case where the at least one second light-shielding strip 60 is disposed on a side of the plurality of selected second wirings 301 proximate to the display surface side of the array substrate 131, and the at least one second light-shielding strip 60 is disposed on a side of the plurality of selected second wirings 301 away from the base substrate 80. FIG. 9C shows a case where the at least one second light-shielding strip 60 is disposed on a side of the plurality of selected second wirings 301 away from the display surface side of the array substrate 131, and the at least one second light-shielding strip 60 is disposed on a side of the plurality of selected second wirings 301 proximate to the base substrate 80.

In some embodiments, as shown in FIG. 9B, the at least one second light-shielding strip 60 is disposed at the side of the plurality of selected first wirings 201 proximate to the display surface side of the array substrate 131, and the at least one second light-shielding strip 60 is disposed on a side of the plurality of selected second wirings 301 away from the base substrate 80. In this way, a process for forming the second light-shielding strip 60 may be included in a process for forming a light-shielding pattern for shielding an active layer of a thin film transistor in the array substrate 131, and thus it is not necessary to additionally provide the process for forming the second light-shielding strip 60, which simplifies a process for manufacturing the array substrate 131.

Referring to FIG. 8B, the at least one second light-shielding strip 60 is disposed at the side of the plurality of second wirings 301 away from or proximate to the display surface side of the array substrate 131. The orthographic projection of each second gathering portion 70 on the display surface is within the orthographic projection of the second light-shielding strip 60 on the display surface. That is, the number of the second light-shielding strips 60 is the same as the number of the second gathering portions 70.

In the array substrate 131 provided by the embodiments of the present disclosure, the selected second wirings 301 passing through the sensing component region C1 are divided into groups. Each group of selected second wirings includes at least two adjacent selected second wirings 301, and selected second wirings 301 in each group of selected second wirings are gathered in the sensing component region C1 to form the second gathering portion 70. That is, selected second wirings 301 in each group of selected second wirings are made closer to each other in the sensing component region C1. In this way, two adjacent selected second wirings 301 in each group of selected second wirings are close together in the sensing component region C1, and two adjacent second gathering portions 70 are further away from each other. The distance between two adjacent second gathering portions 70 is greater than the distance between two adjacent second wirings 30 in the non-sensing component region C2.

In addition, the gap(s) between at least two adjacent selected second wirings 301 in the second gathering portion 70 is blocked by at least one second light-shielding strip 60, which prevents light from passing through the gap(s), and avoids the diffraction phenomenon of light when the light passes through the gap(s) between at least two adjacent selected second wirings 301 in the second gathering portion 70.

In this way, in a case where the light passes through the transparent sensing component region C1 of the array substrate 131, the light passes through a region between two adjacent second light-shielding strips 60. The distance between two adjacent second gathering portions 70 is greater than the distance between two adjacent second wirings 30 in the non-sensing component region C2. That is, in the transparent sensing component region C1, compared with a density of an arrangement of the plurality of second wirings 30 before gathering, a density of an arrangement of the plurality of second gathering portions 70 (which is equivalent to a density of an arrangement of the plurality of second light-shielding strips 60) formed by gathering selected second wirings 301 in each group of selected second wirings is smaller. Therefore, when the light passes through the transparent sensing component region C1, the diffraction phenomenon is alleviated, and the influence of light diffraction on brightness of the light is reduced. Therefore, the accuracy of the information of the light sensed by the sensing component 2 is improved.

In an example where the sensing component 2 is the front camera, since the diffraction phenomenon is further alleviated when the light passes through the transparent sensing component region C1, imaging effect of the front camera is further improved, and brightness and definition of an obtained image are significantly improved.

In some embodiments, with continued reference to FIG. 8A, a distance g between two adjacent second gathering portions 70 in the transparent sensing component region C1 of the array substrate 131 is greater than a distance k between two adjacent second wirings 30 in the non-sensing component region C2. A distance h between two adjacent selected second wirings 301 in each second gathering portion 70 is less than the distance k between two adjacent second wirings 30 in the non-sensing component region C2.

In the above embodiments, the distance g between two adjacent second gathering portions 70 is greater than the distance k between two adjacent second wirings 30 in the non-sensing component region C2. The distance g between two adjacent second gathering portions 70 is a distance between two nearest selected second wirings 301 that are respectively located in two adjacent second gathering portions 70. In this way, compared with the distance k between two adjacent second wirings 30 in the non-sensing component region C2, the distance g between two adjacent second gathering portions 70 becomes larger. Correspondingly, a distance between two adjacent second light-shielding strips 60 is greater than the distance between two adjacent second wirings 30 in the non-sensing component region C2, so that the diffraction phenomenon of light is alleviated when the light passes through the transparent sensing component region C1.

In addition, the distance h between two adjacent selected second wirings 301 in each second gathering portion 70 is less than the distance k between two adjacent second wirings 30 in the non-sensing component region C2. In this way, in each second gathering portion 70, two adjacent selected second wirings 301 are made closer to each other, so that a dimension of the second gathering portion 70 in a direction perpendicular to an extending direction of the second gathering portion 70 (i.e., a width of the second gathering portion 70) is small. Therefore, the distance between two adjacent second gathering portions 70 is large. In this case, the diffraction phenomenon of light is alleviated, and a width of the second light-shielding strip 60 for shielding gap(s) between the at least two adjacent selected second wirings 301 in the second gathering portion 70 is small, so that more light may pass through the transparent sensing component region C1.

In some embodiments, the number of selected second wirings 301 included in each group of selected second wirings is not limited. Each group of selected second wirings may include two selected second wirings 301, which is shown in FIGS. 8A, 8B, and 9A to 9C. Each group of selected second wirings may include more than two selected second wirings 301. For example, the number of selected second wirings 301 included in each group of selected second wirings is three, four or five.

In some embodiments, the number of selected second wirings 301 included in each group of selected second wirings is equal.

For example, the number of selected second wirings 301 included in each group of selected second wirings 301 is two, or the number of selected second wirings 301 included in each group of selected second wirings 301 is three or four or other numbers. FIG. 8A shows a case where each group of selected second wirings 301 in the array substrate includes two selected second wirings 301. In this way, widths of the plurality of second gathering portions 70 corresponding to the plurality of groups of selected second wirings 301 are equal or approximately equal, and widths of the second light-shielding strips 60 are equal or approximately equal. Therefore, in every position of the sensing component region C1, reduction degree of the diffraction of light is equal or approximately equal. Light passing through every position of the sensing component region C1 is uniform, so that the accuracy of the information of the light sensed by the sensing component 2 is improved.

In some embodiments, the distance between any two adjacent second gathering portions 70 is equal. The distance between any two adjacent selected second wirings in each second gathering portion 70 is equal.

For example, as shown in FIG. 8A, the distance between any two adjacent second gathering portions 70 is g. In a case where each group of selected second wirings includes three or more selected second wirings 301, the distance between any two adjacent selected second wirings 301 in each second gathering portion 70 is equal.

In this design, because the distance between any two adjacent second gathering portions 70 is equal, the distance between any two adjacent second light-shielding strips 60 is equal or approximately equal. The distance between any two adjacent selected second wirings 301 in each second gathering portion 70 is equal, so that the widths of the plurality of second gathering portions 70 are equal, and the widths of the plurality of second light-shielding strips 60 are equal or approximately equal. In this way, in every position of the sensing component region C1, the reduction degree of the diffraction of light is equal or approximately equal, and the light passing through every position of the sensing component region C1 is more uniform. Therefore, the accuracy of the information of the light sensed by the sensing component 2 is improved.

In some embodiments of the present disclosure, by setting the width of the second light-shielding strip 60 and the distance between two adjacent second light-shielding strips 60 within respective appropriate ranges, the diffraction phenomenon of light may be further alleviated.

It will be noted that, as shown in FIG. 9A, a width m of the second light-shielding strip 60 refers to a dimension of the second light-shielding strip 60 in a direction perpendicular to the extending direction of the second light-shielding strip 60. A distance p between two adjacent second light-shielding strips 60 refers to a distance between two adjacent second light-shielding strips 60 in a direction perpendicular to the extending direction of the second light-shielding strips 60. For example, in a case where the extending direction of the second light-shielding strip 60 is the second direction, the width m of the second light-shielding strip 60 refers to a dimension of the second light-shielding strip 60 in a direction perpendicular to the second direction, and the distance p between two adjacent second light-shielding strips 60 refers to a distance between two adjacent second light-shielding strips 60 in the direction perpendicular to the second direction.

In addition, by setting the width of the second gathering portion 70, the distance between two adjacent second gathering portions 70 and the number of selected second wirings 301 of a group of selected second wirings corresponding to each second gathering portion 70, the width of the second light-shielding strip 60 and the distance between two adjacent second light-shielding strips 60 may be set.

It is assumed that a lower limit value of the distance p between two adjacent second light-shielding strips 60 is p1, and an upper limit value of the distance p between two adjacent second light-shielding strips 60 is p2.

The distance p between two adjacent second light-shielding strips 60 is greater than or equal to the lower limit value p1, so that when light passes through gap(s) between the plurality of second light-shielding strips 60, the diffraction phenomenon of light that is caused by a small distance p between two adjacent second light-shielding strips 60 may be avoided. The distance p between two adjacent second light-shielding strips 60 is less than or equal to the upper limit value p2, so that a problem that the number of the second light-shielding strips 60 is small due to a large distance p between two adjacent second light-shielding strips 60 may be avoided (in a case where an area of the sensing component region C1 is constant, if the distance p between two adjacent second light-shielding strips 60 is too large, the number of the second light-shielding strips 60 is reduced), and a problem that the number of the second gathering portions 70 corresponding to the second light-shielding strips 60 is reduced may also be avoided. As for the array substrate 131, the number of the second wirings 30 is constant, and the number of the selected second wirings 301 passing through the sensing component region C1 is also constant. If the the number of the second gathering portions is reduced, the number of a group of selected second wirings 301 corresponding to each second gathering portion 70 is large, so that selected second wirings 301 in each group of selected second wirings may interact, and signals transmitted thereon may fluctuate and be inaccurate.

In addition, it is assumed that a lower limit value of the width m of the second light-shielding strip 60 is m1, and an upper limit value of the width m of the second light-shielding strip 60 is m2. The width m of the second light-shielding strip 60 is greater than or equal to the lower limit value m1, so that a problem that a gap between two adjacent selected second wirings 301 in the second gathering portion 70 may not be effectively shielded because the width m of the second light-shielding strip 60 is too small is avoided. The width m of the second light-shielding strip 60 is less than or equal to the upper limit value m2, so that a problem of the diffraction phenomenon of light that is caused by a small distance p between two adjacent second light-shielding strips 60 which is caused by a large width m of the second light-shielding strip 60 may be avoided, and a problem that the amount of the light passing through the sensing component region C1 is reduced may be also avoided.

On this basis, in some embodiments, a ratio of the width m of the second light-shielding strip 60 to the distance p between two adjacent second light-shielding strips 60 is greater than 0, and less than or equal to 0.5. For example, the ratio of the width m of the second light-shielding strip 60 to the distance p between two adjacent second light-shielding strips 60 may be ½, 7.5/16.125, etc.

For example, in a case where the ratio of the width m of the second light-shielding strip 60 to the distance p between two adjacent second light-shielding strips 60 is greater than 0, and less than or equal to 0.5, a sum n of the width m of the second light-shielding strip 60 and the distance p between two adjacent second light-shielding strips 60 is greater than or equal to 94.5 μm, and less than or equal to 200 μm. For example, the sum n of the width m of the second light-shielding strip 60 and the distance p between two adjacent second light-shielding strips 60 may be 94.5 μm, 100 μm, 200 μm, etc.

It will be noted that two opposite sides of the second light-shielding strip 60 in the first direction may exceed borders defined by two outermost selected second wirings 301 in the corresponding second gathering portion 70 (that is, in the first direction, two opposite borders of the second light-shielding strip 60 may exceed two selected second wirings 301 located at two ends of the corresponding group of selected second wirings, respectively), or may also be aligned with the borders defined by the two outermost selected second wirings 301 in the corresponding second gathering portion 70.

In the embodiments of the present disclosure, the ratio of the width m of the second light-shielding strip 60 to the distance p between two adjacent second light-shielding strips 60 is greater than 0, and less than or equal to 0.5, and the sum n of the width m of the second light-shielding strip 60 and the distance p between two adjacent second light-shielding strips 60 is greater than or equal to 94.5 μm, and less than or equal to 200 μm. In this case, it may ensure that the diffraction phenomenon of light is further alleviated when the light passes through the sensing component region C1, so that the information of the light sensed by the sensing component 2 is more accurate.

In some embodiments, the ratio of the width m of the second light-shielding strip 60 to the distance p between two adjacent second light-shielding strips 60 may be equal to or not equal to the ratio of the width d of the first light-shielding strip 40 to the distance e between two adjacent first light-shielding strips 40. The sum n of the width m of the second light-shielding strip 60 and the distance p between two adjacent second light-shielding strips 60 may be equal to or not equal to the sum f of the width d of the first light-shielding strip 40 and the distance e between two adjacent first light-shielding strips 40. For example, in a case where a dimension of a pixel region of the array substrate 131 in the first direction is less than a dimension of a pixel region of the array substrate 131 in the second direction, the sum n of the width m of the second light-shielding strip 60 and the distance p between two adjacent second light-shielding strips 60 is greater than the sum f of the width d of the first light-shielding strip 40 and the distance e between two adjacent first light-shielding strips 40. For example, the sum n of the width m of the second light-shielding strip 60 and the distance p between two adjacent second light-shielding strips 60 is 180 μm, and the sum f of the width d of the first light-shielding strip 40 and the distance e between two adjacent first light-shielding strips 40 is 120 μm.

In the array substrate 131 provided by some embodiments of the present disclosure, in the extending direction of the second light-shielding strip 60, there are some places where thin film transistors are provided, and there are some places where thin film transistors are not provided. Therefore, in a design of the second light-shielding strip 60, in some embodiments, the width of the second light-shielding strip 60 is different along the extending direction of the second light-shielding strip 60. For example, in the place where the thin film transistor is provided, a width of the second light-shielding strip 60 is large, and in the place where the thin film transistor is not provided, a width of the second light-shielding strip 60 is small. In this way, at the place where the width of the second light-shielding strip 60 is small, a distance between two adjacent second light-shielding strips 60 is increased, so that more light may pass through the sensing component region C1 to be sensed by the sensing component 2.

It will be noted that in a case where the width of the second light-shielding strip 60 is different along the extending direction of the second light-shielding strip 60, a distance p between two adjacent second light-shielding strips 60 refers to a distance between two adjacent second light-shielding strips 60 at a same position in a direction perpendicular to the extending direction of the second light-shielding strips 60.

In some embodiments, the width of the same second light-shielding strip 60 is equal everywhere along the extending direction of the second light-shielding strip 60. In this way, the process of forming the second light-shielding strip 60 may be simplified, and manufacturing efficiency may be improved. In some examples, in a case where the width of the same second light-shielding strip 60 is equal everywhere, the distance between two adjacent second light-shielding strips 60 may be equal or different along the first direction. For example, in a case where the width of each second light-shielding strip 60 is equal everywhere, widths of the plurality of second light-shielding strips of 60 are equal. In this way, in a case where the second light-shielding strip 60 is formed, the process may be simplified and difficulty of the process may be reduced.

In the case where the widths of the plurality of second light-shielding strips 60 are equal, the number of the plurality of selected second wirings 301 corresponding to each second gathering portion 70 is equal, and the distance between any two adjacent selected second wirings 301 in each group of selected second wirings is equal. In this way, a degree of interaction among the plurality of selected second wirings 301 in each group of selected second wirings is the same, so that influence of the plurality of groups of selected second wirings 301 in the sensing component region C1 on light passing through the sensing component region C1 is the same. Therefore, the accuracy of the information of light collected by the sensing component 2 is improved.

In some embodiments, the second wiring 30 includes one or more second sub-wirings 30a. For example, as shown in FIG. 8A, the second wiring 30 includes one second sub-wiring 30a. As shown in FIG. 7, the second wiring 30 includes two second sub-wirings 30a. In a case where the second wiring 30 includes a plurality of second sub-wirings 30a, two adjacent second sub-wirings 30a are at intervals. Since the selected second wirings 301 are wirings passing through the sensing component region C1 in the plurality of second wirings 30 in the array substrate 131, the aforementioned embodiments are also suitable for each selected second wiring 301.

In some embodiments, in a case where the second direction is a row direction, the second sub-wiring(s) 30a included in the second wiring 30 are at least one of a gate line, a control line, a common signal line (Com line), and the like. In some embodiments, in a case where the second direction is a column direction, the second sub-wiring(s) 30a included in the second wiring 30 are at least one of a data line, an initialization signal line, a first power line (Vdd line), a second powerline (Vss line), and the like. Since the selected second wirings 301 are wirings passing through the sensing component region C1 in the plurality of second wirings 30 in the array substrate 131, the aforementioned embodiments are also suitable for each selected second wiring 301.

In some embodiments, in a case where a second wiring 30 includes a plurality of second sub-wirings 30a, types of the second sub-wirings 30a included in the second wiring 30 may be the same or different. For example, the second wiring 30 includes two gate lines. For another example, the second wiring 30 includes one gate line and one Vss line. Since the selected second wirings 301 are wirings passing through the sensing component region C1 in the plurality of second wirings 30 in the array substrate 131, the aforementioned embodiments are also suitable for each selected second wiring 301.

In some embodiments, the number of the plurality of first sub-wirings 20a included in the first wiring 20 is the same as the number of the plurality of second sub-wirings 30a included in the second wiring 30. For example, both the number of the plurality of first sub-wirings 20a included in the first wiring 20 and the number of the plurality of second sub-wirings 30a included in the second wiring 30 are two. In some embodiments, the number of the plurality of first sub-wirings 20a included in the first wiring 20 is different from the number of the plurality of second sub-wirings 30a included in the second wiring 30.

In some embodiments, as shown in FIGS. 8B and 9A, the at least one first light-shielding strip 40 and the at least one second light-shielding strip 60 in the array substrate 131 may be in a same layer and made of the same material. The at least one first light-shielding strip 40 and the at least one second light-shielding strip 60 may constitute a one-piece structure. In this way, the at least one first light-shielding strip 40 and the at least one second light-shielding strip 60 may be formed in a same manufacturing process, thereby simplifying the manufacturing process and reducing steps of the process. Further, the at least one first light-shielding strip 40 and the at least one second light-shielding strip 60 may be formed in a same layer as the light-shielding pattern for shielding the active layer of the thin film transistor in the array substrate 131. In this way, a process for forming the at least one first light-shielding strip 40 and the at least one second light-shielding strip 60 may be included in a process for forming the light-shielding pattern, and thus it is not necessary to additionally provide the process for forming the at least one first light-shielding strip 40 and the at least one second light-shielding strip 60, which simplifies the process for manufacturing the array substrate.

In the embodiment of the present disclosure, a material of the at least one first light-shielding strip 40 and a material of the at least one second light-shielding strip 60 are not limited, as long as the material may play a role of light shielding. For example, the material of the at least one first light-shielding strip 40 and the material of the at least one second light-shielding strip 60 are one of opaque materials such as black ink, black resin, and metal. In a case where the material of the at least one first light-shielding strip 40 is a conductive material such as metal, an insulating layer is provided between the at least one first light-shielding strip 40 and the plurality of selected first wirings 201 in the array substrate 131 to avoid electrical connection therebetween. In a case where the material of the at least one second light-shielding strip 60 is a conductive material such as metal, an insulating layer is provided between the at least one second light-shielding strip 60 and the plurality of selected second wirings 301 to avoid electrical connection therebetween.

In some embodiments, as shown in FIGS. 8B and 9A, the plurality of first light-shielding strips 40 and the plurality of second light-shielding strips 60 constitute a grid structure, and define a plurality of light-transmissive regions C11. Portions of the plurality of first light-shielding strips 40 intersecting the plurality of second light-shielding strips 60 are a plurality of light-shielding portions, and the light-shielding portion overlaps a corresponding pixel in the first region.

As shown in FIGS. 3A and 3B, some embodiments of the present disclosure provide a display panel 13, and the display panel includes the array substrate 131 according to any one of the above embodiments.

The display panel 13 provided by embodiments of the present disclosure may be a liquid crystal display (LCD) panel, an organic light-emitting display (OLED) panel, or a quantum dot light-emitting display (QLED) panel.

In a case where the display panel is the LCD panel, the display panel 13 includes the array substrate 131, a color filter substrate and a liquid crystal layer between the array substrate 131 and the color filter substrate.

In a case where the display panel 13 is the OLED panel or the QLED panel, the display panel 13 includes the array substrate 131 and an encapsulation layer for encapsulating the array substrate 131. The array substrate 131 includes thin film transistors and light-emitting devices, and the light-emitting device includes an anode, a light-emitting layer and a cathode. The encapsulation layer may be a film encapsulation layer or a substrate encapsulation layer.

As shown in FIG. 4A, the display panel 13 provided by some embodiments of the present disclosure has the sensing component region C1 and the non-sensing component region C2. The non-sensing component region C2 has a display function, and the sensing component region C1 is transparent and has a display function. It may be known from the foregoing embodiments that, in the sensing component region C1 of the array substrate 131 of the display panel 13, the first wirings 20 (or the first wirings 20 and the second wirings 30) passing through the sensing component region C1 are gathered, the distance between two adjacent first gathering portions 50 (or the distance between two adjacent first gathering portions 50 and the distance between two adjacent second gathering portions 70) is increased. Therefore, when the light passes through the sensing component region C1, the diffraction phenomenon of light is alleviated, so that the accuracy of the information of the light sensed by the sensing component 2 is improved.

With continued reference to FIG. 4A, in some embodiments, the display panel 13 may further have a non-display area D. The non-display area D may be, for example, a region provided with a frame.

As shown in FIGS. 3A and 3B, some embodiments of the present disclosure provide a display device 300. The display device 300 includes a display panel 13 and at least one sensing component 2. The display panel 13 is the display panel 13 provided by the foregoing embodiments.

The at least one sensing component 2 is disposed at a non-display surface side of the display panel 13, and an orthographic projection of the at least one sensing component 2 on the display panel 13 is within the sensing component region C1 of the display panel 13. In addition, a sensing surface of each sensing component 2 faces the display panel 13. For example, the at least one sensing component 2 includes one or more of a front camera, a light sensor, a 3D sensing module, and the like.

For example, in a case where the sensing component 2 includes the front camera, a light-sensing surface of the front camera faces the display panel 13, and the front camera may capture an image of an object to be photographed located at a front side (i.e., the display surface side) of the display device 300 through the sensing component region C1 of the display panel 13. In a case where the sensing component 2 includes a light sensor, a light-sensing surface of the light sensor faces the display panel 13 to sense light from the front side (i.e., the display surface side) of the display device 300 through the sensing component region C1 of the display panel 13. In a case where the sensing component 2 includes the 3D sensing module, a light-emitting surface and a light-sensing surface of the 3D sensing module face the display panel 13, so as to emit light to an object located at the front side (i.e., the display surface side) of the display device 300 through the sensing component region C1 of the display panel 13, and receive light reflected back by the object to realize sensing a 3D spatial structure of the object.

In the display device 300, light passing through the sensing component region C1 of the display panel 13 is not diffracted or has a low degree of diffraction, thereby improving the accuracy of the information of light sensed by the at least one sensing component 2. For example, in a case where the at least one sensing component 2 includes a front camera, a captured image has high brightness and high definition.

In the display device 300, a region that directly faces the sensing component 2 such as the front camera (i.e., the sensing component region C1) has high light transmittance and low light diffraction. Therefore, in a case where the display device 300 is applied to a terminal such as a mobile phone or a tablet, a screen-to-body ratio of a screen of the terminal may be greatly increased, a full-screen display may be achieved, and the light-sensing effect of the sensing component 2 is not affected by the diffraction of light or is slightly affected by the diffraction of light.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising a first region and a second region surrounding the first region, a light transmittance of the first region being greater than a light transmittance of the second region, and the display panel comprising:
    a plurality of pixels located in the first region and the second region;
    a plurality of first wirings sequentially arranged in a second direction, wherein the plurality of first wirings are located in the first region and the second region, and are electrically connected to the plurality of pixels; and
    a plurality of second wirings sequentially arranged in a first direction, wherein the plurality of second wirings are located in the first region and the second region, and are electrically connected to the plurality of pixels; the first direction and the second direction intersect;
    wherein first wirings passing through the first region in the plurality of first wirings comprise a plurality of first wiring groups, and first wirings in each first wiring group are gathered in the first region to constitute a first gathering portion;
    a distance between two adjacent first gathering portions is greater than a distance between two adjacent first wirings in the second region; and a distance between two adjacent first wirings in the first gathering portion is less than the distance between the two adjacent first wirings in the second region.

2. The display panel according to claim 1, wherein a part of the first wirings in each first wiring group are electrically connected to a part of pixels located in the first region, and another part of the first wirings in the first wiring group are electrically connected to a part of pixels located in the second region and are not electrically connected to the pixels located in the first region.

3. The display panel according to claim 1, further comprising a plurality of first light-shielding strips disposed in the first region, wherein the plurality of first light-shielding strips are disposed on a side of the plurality of first wiring groups away from or proximate to a display surface of the display panel; and a first light-shielding strip in the plurality of first light-shielding strips is configured to block a gap between at least two adjacent first wirings in a corresponding first wiring group in the first region.

4. The display panel according to claim 3, wherein in the second direction, two opposite borders of the first light-shielding strip exceed two first wirings located at two ends of the corresponding first wiring group, respectively.

5. The display panel according to claim 3, wherein an orthographic projection, on the display panel, of the first gathering portion constituted by the first wirings in the first wiring group in the first region is located within an orthographic projection of a corresponding first light-shielding strip on the display panel.

6. The display panel according to claim 3, wherein in the plurality of first light-shielding strips, a ratio of a width of a first light-shielding strip to a distance between two adjacent first light-shielding strips is greater than 0, and less than or equal to 0.5.

7. The display panel according to claim 1, wherein a first wiring in the plurality of first wirings includes one or more first sub-wirings.

8. The display panel according to claim 1, wherein second wirings passing through the first region in the plurality of second wirings comprise a plurality of second wiring groups, and second wirings in each second wiring group are gathered in the first region to constitute a second gathering portion;
    a distance between two adjacent second gathering portions is greater than a distance between two adjacent second wirings in the second region; and
    a distance between two adjacent second wirings in the second gathering portion is less than the distance between the two adjacent second wirings in the second region.

9. The display panel according to claim 8, wherein a part of the second wirings in each second wiring group are electrically connected to a part of pixels located in the first region, and another part of the second wirings in the second wiring group are electrically connected to a part of pixels located in the second region and are not electrically connected to the pixels located in the first region.

10. The display panel according to claim 8, further comprising a plurality of second light-shielding strips disposed in the first region, wherein the plurality of second light-shielding strips are disposed on a side of the plurality of second wiring groups away from or proximate to a display surface of the display panel; and a second light-shielding strip in the plurality of second light-shielding strips is configured to block a gap between at least two adjacent second wirings in a corresponding second wiring group in the first region.

11. The display panel according to claim 10, wherein in the first direction, two opposite borders of the second light-shielding strip exceed two second wirings located at two ends of the corresponding second wiring group, respectively.

12. The display panel according to claim 10, wherein an orthographic projection, on the display panel, of the second gathering portion constituted by the second wirings in the second wiring group in the first region is located within an orthographic projection of a corresponding second light-shielding strip on the display panel.

13. The display panel according to claim 10, wherein in the plurality of second light-shielding strips, a ratio of a width of a second light-shielding strip to a distance between two adjacent second light-shielding strips is greater than 0, and less than or equal to 0.5.

14. The display panel according to claim 10, further comprising a plurality of first light-shielding strips disposed in the first region, wherein the plurality of first light-shielding strips are disposed on a side of the plurality of first wiring groups away from or proximate to the display surface of the display panel; and a first light-shielding strip in the plurality of first light-shielding strips is configured to block a gap between at least two adjacent first wirings in a corresponding first wiring group in the first region;
the plurality of first light-shielding strips and the plurality of second light-shielding strips are located in a same layer, are made of a same material, and constitute a one-piece structure.

15. The display panel according to claim 14, wherein the plurality of first light-shielding strips and the plurality of second light-shielding strips constitute a grid structure, and define a plurality of light-transmissive regions;
portions of the plurality of first light-shielding strips intersecting the plurality of second light-shielding strips are a plurality of light-shielding portions, and a light-shielding portion in the plurality of light-shielding portions overlaps a corresponding pixel in the first region.

16. The display panel according to claim 8, wherein a second wiring in the plurality of second wirings includes one or more second sub-wirings.

17. The display panel according to claim 1, wherein the first direction is a column direction, and a first wiring in the plurality of first wirings includes at least one of a data line, an initialization signal line, a first power line and a second power line; and the second direction is a row direction, and a second wiring in the plurality of second wirings includes at least one of a gate line, a control line and a common voltage signal line; or
the first direction is the row direction, and the first wiring includes at least one of the gate line, the control line and the common voltage signal line; and the second direction is the column direction, and the second wiring includes at least one of the data line, the initialization signal line, the first power line and the second power line.

18. The display panel according to claim 1, wherein a density of pixels located in the first region is less than a density of pixels in the second region.

19. A display device, comprising:
the display panel according to claim 1; and
at least one sensing component disposed on a non-display surface side of the display panel, wherein an orthographic projection of the at least one sensing component on the display panel is at least partially located in the first region.

20. The display device according to claim 19, wherein a sensing component in the at least one sensing component is a camera.

* * * * *